(12) United States Patent
Mitsui

(10) Patent No.: US 7,728,678 B2
(45) Date of Patent: Jun. 1, 2010

(54) SEMICONDUCTOR DEVICE OUTPUTTING OSCILLATION SIGNAL

(75) Inventor: Katsuyoshi Mitsui, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 46 days.

(21) Appl. No.: 12/253,636

(22) Filed: Oct. 17, 2008

(65) Prior Publication Data
US 2009/0128243 A1 May 21, 2009

(30) Foreign Application Priority Data
Nov. 16, 2007 (JP) .............................. 2007-298370

(51) Int. Cl.
*H03L 7/00* (2006.01)
*H03L 7/06* (2006.01)

(52) U.S. Cl. ..................... 331/17; 331/1 R; 331/8; 331/1 A; 331/57

(58) Field of Classification Search .............. 331/1 R, 331/8, 16, 17, 1 A, 57
See application file for complete search history.

(56) References Cited

U.S. PATENT DOCUMENTS
4,278,947 A * 7/1981 Nicollian et al. ............ 331/1 R
2006/0063502 A1 3/2006 Shibuya et al.

FOREIGN PATENT DOCUMENTS
JP 06-303133 10/1994
JP 2006-086997 3/2006

* cited by examiner

*Primary Examiner*—David Mis
(74) *Attorney, Agent, or Firm*—McDermott Will & Emery LLP

(57) ABSTRACT

A semiconductor device includes a voltage control and oscillation circuit oscillating at a frequency according to a first control voltage to output an oscillation signal, a frequency/voltage conversion circuit receiving the oscillation signal from the voltage control and oscillation circuit and converting a frequency of the oscillation signal into a voltage, a control voltage generation circuit generating a new second control voltage having a level between that of the voltage converted by the frequency/voltage conversion circuit and that of a second control voltage generated previously, and an analog integration circuit integrating the second control voltage to generate the first control voltage and outputting the first control voltage to the voltage control and oscillation circuit.

14 Claims, 12 Drawing Sheets

SEMICONDUCTOR DEVICE OUTPUTTING OSCILLATION SIGNAL

BACKGROUND OF THE INVENTION

1. Field of the Invention

The present invention relates to semiconductor devices, in particular, a semiconductor device that outputs an oscillation signal.

2. Description of the Background Art

A universal microcontroller product requires not only a conventional oscillation control circuit controlling an external crystal resonator, an external ceramic resonator and the like, but also an oscillation circuit (an on-chip oscillator circuit) incorporated in a semiconductor device without requiring an external crystal resonator or an external ceramic resonator. On-chip oscillator circuits vary widely in terms of required specifications such as oscillation frequencies, frequency accuracy and allowable power consumption.

For example, Japanese Patent Laying-Open No. 2006-086997 discloses the following oscillation circuit. That is, an oscillator oscillating at a frequency according to a control signal to generate an output signal, a frequency-to-voltage converter generating a detection signal of a voltage according to a frequency of the output signal from the oscillator, a difference detector generating a difference signal indicating a difference between the detection signal and a reference signal and an integrator integrating the difference signal to generate a control signal are connected in a closed loop.

Moreover, Japanese Patent Laying-Open No. 06-303133 discloses the following oscillation circuit. That is, the oscillation circuit has a self-propelled oscillation unit, and outputs an oscillation signal. The oscillation circuit includes an oscillator having a frequency of an output controlled by a control signal, a first frequency-to-voltage converter receiving the output from the oscillator or a signal obtained by dividing the output from the oscillator, a second frequency-to-voltage converter receiving a reference frequency signal or a signal obtained by dividing the reference frequency signal, and a subtracter receiving an output from the first frequency-to-voltage converter and an output from the second frequency-to-voltage converter and outputting a difference between the output from the first frequency-to-voltage converter and the output from the second frequency-to-voltage converter. Herein, the oscillator receives the output from the subtracter or a signal obtained by amplifying the output from the subtracter. A frequency of the output from the oscillator is controlled by a frequency of the reference frequency signal.

However, each of the oscillation circuit disclosed in Japanese Patent Laying-Open No. 2006-086997 and the oscillation circuit disclosed in Japanese Patent Laying-Open No. 06-303133 integrates a signal having a voltage level which changes at every cycle that an oscillation frequency is converted into a voltage. Consequently, the integrator requires a rapid response and increases in amount of electric current to be consumed.

SUMMARY OF THE INVENTION

An object of the present invention is to provide a semiconductor device capable of outputting an oscillation signal and achieving low power consumption.

In summary, a semiconductor device according to one aspect of the present invention generates a new second control voltage having a level between that of a voltage converted from a frequency of an oscillation signal and that of a second control voltage generated previously. Then, the semiconductor device integrates the second control voltage to generate a first control voltage, and oscillates at a frequency according to the first control voltage to output an oscillation signal.

According to this aspect of the present invention, it is possible to achieve gentle change in second control voltage to be integrated. Accordingly, the semiconductor device can output an oscillation signal and achieve low power consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
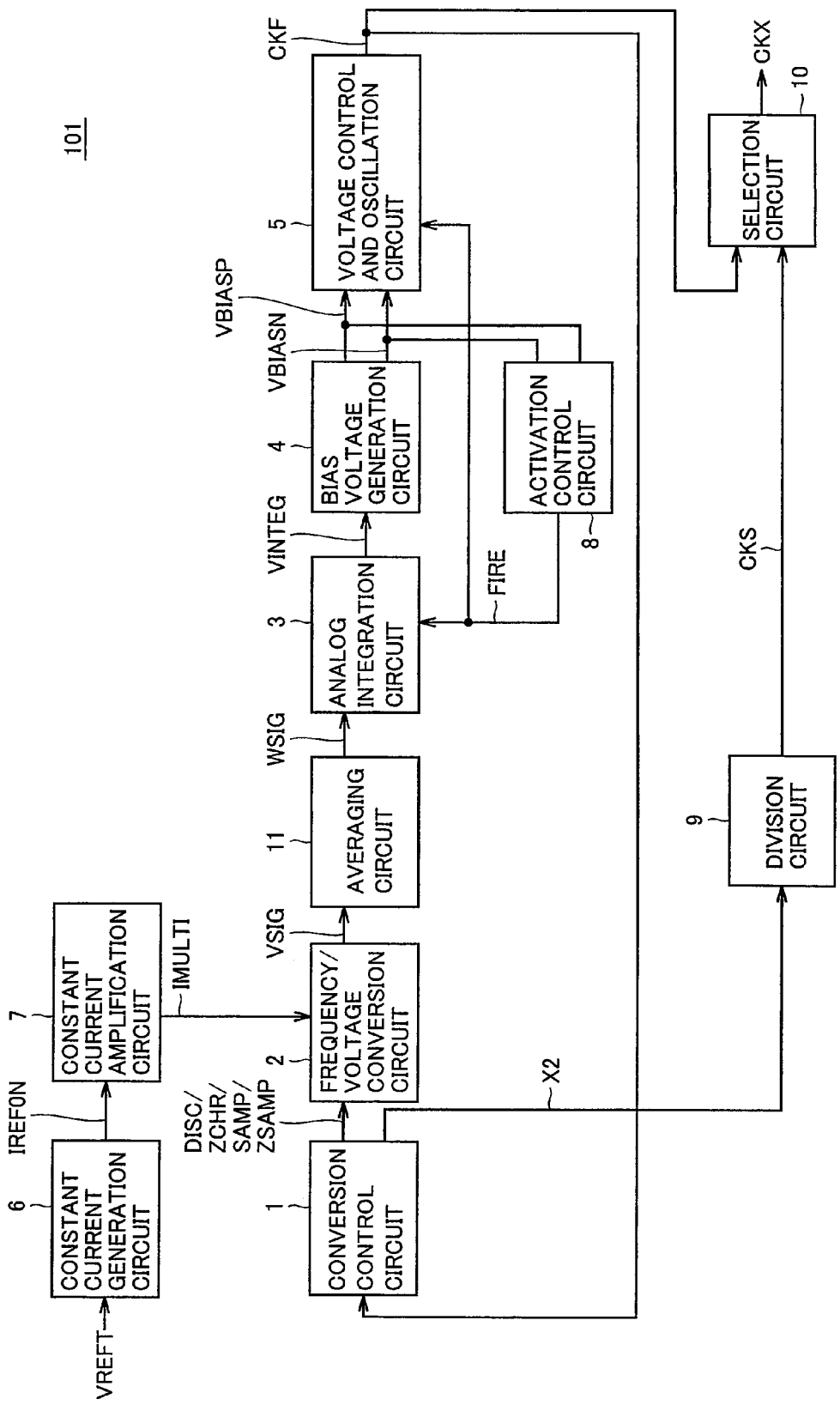
FIG. 1 shows a block diagram of a configuration of a semiconductor device according to one embodiment of the present invention.

With reference to the drawings, hereinafter, description will be given of preferred embodiments of the present invention. It is to be noted that identical or corresponding parts are denoted by identical reference symbols in the drawings; therefore, description thereof will not be given repeatedly.

FIG. 1 shows a block diagram of a configuration of a semiconductor device according to one embodiment of the present invention.

With reference to FIG. 1, semiconductor device 101 includes a conversion control circuit 1, a frequency/voltage conversion circuit 2, an analog integration circuit 3, a bias voltage generation circuit 4, a voltage control and oscillation circuit 5, a constant current generation circuit 6, a constant current amplification circuit 7, an activation control circuit 8, a division circuit 9, a selection circuit 10 and an averaging circuit (a control voltage generation circuit) 11.

Constant current generation circuit 6 generates a constant current IREF0N having a small ratio of change dI/dT of an electric current I to a change of a temperature T, and outputs constant current IREF0N to constant current amplification circuit 7.

Constant current amplification circuit 7 amplifies constant current IREF0N received from constant current generation circuit 6, and outputs a constant current IMULTI obtained by the amplification to frequency/voltage conversion circuit 2. Herein, constant current amplification circuit 7 has a variable amplification factor.

Conversion control circuit 1 generates timing signals DISC, ZCHR, SAMP and ZSAMP, based on an oscillation signal CKF received from voltage control and oscillation circuit 5, and outputs timing signals DISC, ZCHR, SAMP and ZSAMP to frequency/voltage conversion circuit 2. Moreover, conversion control circuit 1 outputs to division circuit 9 an oscillation signal X2 obtained by dividing oscillation signal CKF received from voltage control and oscillation circuit 5 into two.

Frequency/voltage conversion circuit 2 charges a capacitor (to be described later) with constant current IMULTI received from constant current amplification circuit 7, based on timing signals DISC, ZCHR, SAMP and ZSAMP received from conversion control circuit 1. Frequency/voltage conversion circuit 2 charges the capacitor to convert a frequency of oscillation signal CKF outputted from voltage control and oscillation circuit 5 into a conversion voltage VSIG, and outputs conversion voltage VSIG to averaging circuit 11.

Averaging circuit 11 averages conversion voltage VSIG received from frequency/voltage conversion circuit 2 and a control voltage WSIG generated previously to generate a new control voltage WSIG, and outputs control voltage WSIG to analog integration circuit 3.

Analog integration circuit 3 integrates control voltage WSIG to generate a control voltage VINTEG, and outputs control voltage VINTEG to bias voltage generation circuit 4.

Bias voltage generation circuit 4 generates a bias voltage VBIASP and a bias voltage VBIASN, based on control voltage VINTEG outputted from analog integration circuit 3, and outputs bias voltage VBIASP and bias voltage VBIASN to voltage control and oscillation circuit 5.

Voltage control and oscillation circuit 5 oscillates based on bias voltage VBIASP and bias voltage VBIASN received from bias voltage generation circuit 4, thereby outputting oscillation signal CKF to each of conversion control circuit 1 and selection circuit 10.

Activation control circuit 8 outputs a control signal FIRE to each of analog integration circuit 3 and voltage control and oscillation circuit 5 in order to control start and stop of the integrating operation performed by analog integration circuit 3 and the oscillating operation performed by voltage control and oscillation circuit 5.

Division circuit 9 includes a single-stage or multi-stage division circuit, and outputs to selection circuit 10 an oscillation signal CKS obtained by further dividing oscillation signal X2 received from conversion control circuit 1.

Selection circuit 10 selects one of oscillation signal CKF received from voltage control and oscillation circuit 5 and oscillation signal CKS received from division circuit 9, and outputs the selected oscillation signal as an oscillation signal CKX to an external device.

In order to obtain oscillation signal CKS at 32 kHz, for example, the number of stages of the division circuit in division circuit 9 is set at four. Thus, when oscillation signal CKF is set at, for example, 1 MHz, oscillation signal CKS at about 32 kHz (1 MHz/32) can be obtained by a dividing operation performed by a division circuit DIV1 in conversion control circuit 1 and the dividing operation performed by division circuit 9.

Figure 2:
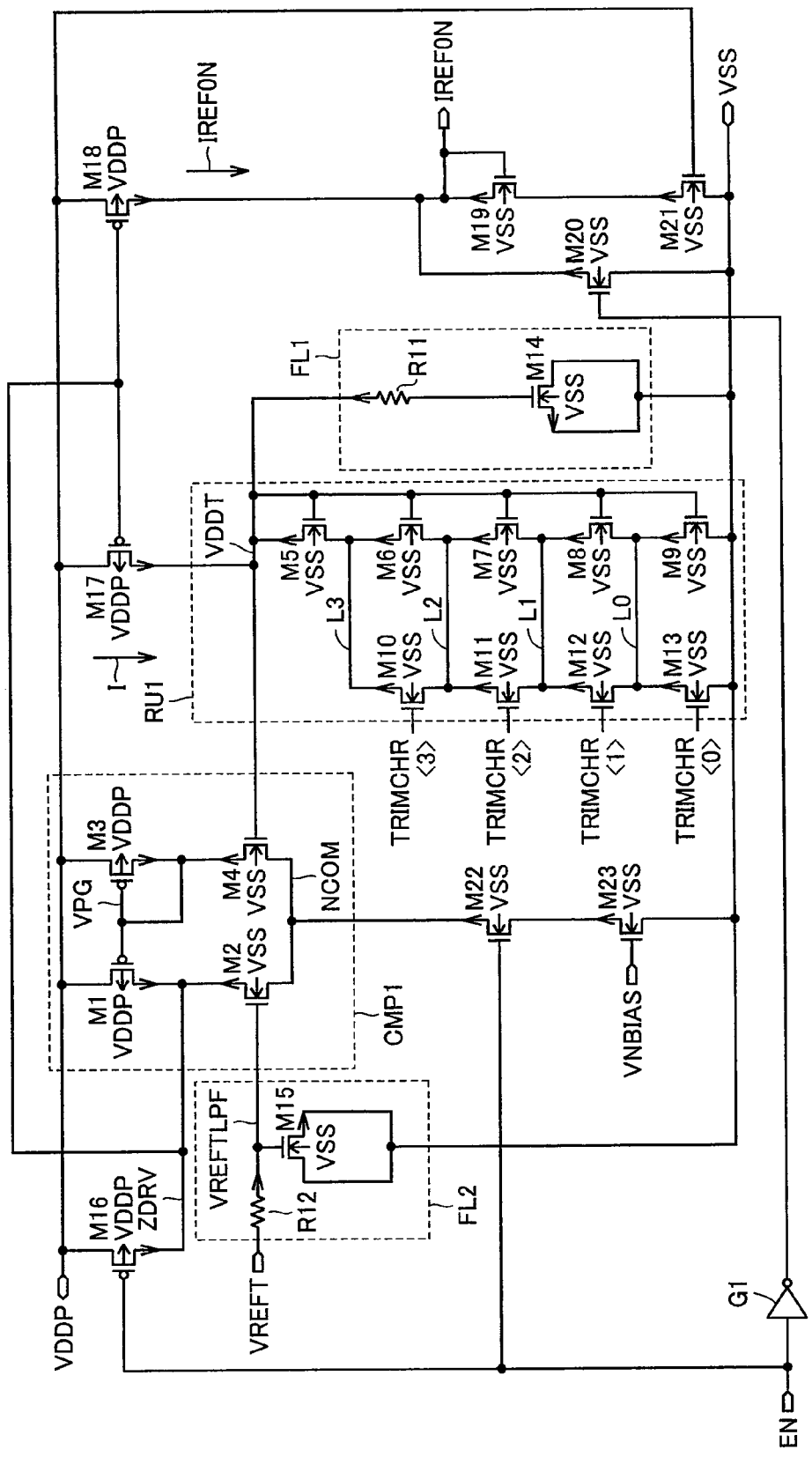
FIG. 2 shows a circuit diagram of a configuration of a constant current generation circuit 6 in the semiconductor device according to the embodiment of the present invention.

FIG. 2 shows a circuit diagram of a configuration of constant current generation circuit 6 in the semiconductor device according to the embodiment of the present invention.

With reference to FIG. 2, constant current generation circuit 6 includes a comparator CMP1, filters FL1 and FL2, a resistor unit RU1, a NOT gate G1, P-channel MOS (Metal Oxide Semiconductor) transistors M16, M17 and M18, and N-channel MOS transistors M19, M20, M21, M22 and M23. Comparator CMP1 includes P-channel MOS transistors M1 and M3, and N-channel MOS transistors M2 and M4. Filter FL1 includes a resistor R11 and an N-channel MOS transistor (a MOS capacitor) M14. Filter FL2 includes a resistor R12 and an N-channel MOS transistor (a MOS capacitor) M15. Resistor unit RU1 includes N-channel MOS transistors M5 to M9 and N-channel MOS transistors M10 to M13.

In comparator CMP1, P-channel MOS transistor M1 has a source connected to a power supply node VDDP supplied with a power supply voltage VDD, a drain connected to a drain of N-channel MOS transistor M2, and a gate connected to a gate of P-channel MOS transistor M3. P-channel MOS transistor M3 has a source connected to power supply node VDDP supplied with power supply voltage VDD, and the gate and a drain connected to each other. N-channel MOS transistor M2 has the drain connected to the drain of P-channel MOS transistor M1, a source connected to a node NCOM, and a gate connected to a node VREFTLPF, that is, a gate of N-channel MOS transistor M15 in filter FL2. N-channel MOS transistor M4 has a drain connected to the drain of P-channel MOS transistor M3, a source connected to node NCOM, and a gate connected to a node VDDT, that is, a drain of N-channel MOS transistor M5 in resistor unit RU1.

An externally received enable signal EN is outputted to each of a gate of N-channel MOS transistor M22, a gate of P-channel MOS transistor M16, and NOT gate G1. N-channel MOS transistor M22 has a drain connected to node NCOM, and a source connected to a drain of N-channel MOS transistor M23. N-channel MOS transistor M23 has a gate connected to a node VNBIAS supplied with a bias voltage VNBIAS.

P-channel MOS transistor M17 has a source connected to power supply node VDDP, a drain connected to node VDDT, and a gate. P-channel MOS transistor M18 has a source connected to power supply node VDDP, a drain connected to a node IREF0N, and a gate connected to the gate of P-channel MOS transistor M17.

In resistor unit RU1, gates of N-channel MOS transistors M5 to M9 are connected to node VDDT. A source of N-channel MOS transistor M5 and drains of N-channel MOS transistors M6 and M10 are connected at a node L3. Sources of N-channel MOS transistors M6 and M10 and drains of N-channel MOS transistors M7 and M11 are connected at a node L2. Sources of N-channel MOS transistors M7 and M11 and drains of N-channel MOS transistors M8 and M12 are connected at a node L1. Sources of N-channel MOS transistors M8 and M12 and drains of N-channel MOS transistors M9 and M13 are connected at a node L0. N-channel MOS transistors M10 to M13 receive reference current value adjustment signals TRIMCHR<3> to TRIMCHR<0> at gates thereof, respectively.

In filter FL1, N-channel MOS transistor M14 has a drain and a source each connected to a ground node VSS, and a gate connected to a first end of resistor R11. A second end of resistor R11 is connected to node VDDT.

In filter FL2, N-channel MOS transistor M15 has a drain and a source each connected to ground node VSS, and the gate connected to a first end of resistor R12. A second end of resistor R12 is connected to a node VREFT supplied with a reference voltage VREFT.

N-channel MOS transistor M19 has a drain and a gate each connected to node IREF0N, and a source connected to a drain of N-channel MOS transistor M21. N-channel MOS transistor M19 forms a current mirror circuit in conjunction with N-channel MOS transistors M163 to M169 (to be described later) in constant current generation circuit 6.

NOT gate G1 inverts a logic level of externally received enable signal EN, and outputs the resultant signal to a gate of N-channel MOS transistor M20. A drain of N-channel MOS transistor M20 is connected to node IREF0N.

A drain of N-channel MOS transistor M16 is connected to the gates of P-channel MOS transistors M17 and M18, the drain of N-channel MOS transistor M1 and the drain of P-channel MOS transistor M2 at a node ZDRV.

Sources of P-channel MOS transistors M16 to M18 and a gate of N-channel MOS transistor M21 are connected to power supply node VDDP. The drains and sources of N-channel MOS transistors M14 and M15 and sources of N-channel MOS transistors M9, M13, M23, M20 and M21 are connected to ground node VSS.

When enable signal EN is set at a logic high level, constant current generation circuit 6 starts to generate a constant current.

Filter FL1 removes a noise component from a voltage VDDT to be applied to node VDDT. Filter FL2 removes a noise component from externally received reference voltage VREFT (dVREFT/dT≅0 (V/K)) having a small temperature coefficient.

Comparator CMP1 outputs voltage VDDT (dVDDT/dT≅0 (V/K)), which is equal in potential to reference voltage VREFT passing through filter FL2, to node VDDT at a low impedance.

N-channel MOS transistors M5 to M9 are in diode connection. Constant current IREF0N corresponding to constant current I flowing through N-channel MOS transistors M5 to M9 connected in series in resistor unit RU1 is output.

N-channel MOS transistors M10 to M13 are arranged in correspondence with N-channel MOS transistors M6 to M9. N-channel MOS transistors M11 to M13 determine whether or not to short-circuit between the drain and the source of the corresponding N-channel MOS transistor, based on externally received reference current value adjustment signals TRIMCHR<3> to TRIMCHR<0>, respectively.

When voltage VDDT is applied to node VDDT, that is, at a high voltage side of resistor unit RU1, constant current I flows from node VDDT to ground node VSS. When a resistance value of resistor unit RU1 is represented by Rch, constant current I is obtained from an expression, VDDT/Rch=VREFT/Rch, by the Ohm's law.

Herein, a drain-to-source resistance (a MOS channel resistance) Rmos of the diode-connected MOS transistor has a positive temperature coefficient in a region where voltage VDDT is high. That is, an expression, dRmos/dT>0 (Ω/K), is established. On the other hand, MOS channel resistance Rmos has a negative temperature coefficient in a sub-threshold region where voltage VDDT is low. That is, an expression, dRmos/dT<0 (Ω/K), is established. Moreover, when voltage VDDT has a certain voltage value near a threshold voltage of the MOS transistor, the temperature coefficient of MOS channel resistance Rmos becomes zero. That is, an expression, dRmos/dT=0 (Ω/K), is established.

Therefore, by adjustment of the value of voltage VDDT, that is, reference voltage VREFT, it is possible to obtain constant current I which is small in temperature dependence, that is, to achieve an expression, dI/dT=d(VREFT/Rch)/dT≅0 (nA/K).

Moreover, a MOS channel resistance operating point at which the temperature coefficient of MOS channel resistance Rmos becomes zero is near the threshold voltage of the MOS transistor. Therefore, it is possible to obtain constant current I which is small in temperature dependence, at a MOS channel resistance in a small area. Further, it is possible to reduce an absolute value of constant current I which is small in temperature dependence.

Herein, constant current I obtained when voltage VDDT is near the threshold value of the MOS transistor has a small absolute value and, therefore, has a width of several times depending on various conditions. Consequently, it is difficult to use constant current I as it is.

In order to avoid this disadvantage, constant current generation circuit 6 in the semiconductor device according to the embodiment of the present invention changes reference current value adjustment signals TRIMCHR<0> to TRIMCHR<3>, thereby increasing/decreasing a combined channel length of the MOS transistors in resistor unit RU1, that is, a combined resistance value Rch. Thus, it is possible to obtain a constant current IREF0N having an absolute value in a range between several tens of nanoamperes and several hundreds of nanoamperes. In other words, it is possible to obtain an optimal constant current IREF0N through use of a simple, small-sized circuit using only digital trimming information of several bits, that is, reference current value adjustment signals TRIMCHR<0> to TRIMCHR<3>.

Herein, the following circuit is considered as a configuration for generating a constant current, in addition to the configuration like constant current generation circuit 6. That is, a voltage having a temperature coefficient corresponding to temperature dependence of a constant current generating resistor is generated at a band gap reference voltage circuit. Then, when an output voltage from the band gap reference voltage circuit is applied to the constant current generating resistor, a constant current is generated.

In general, temperature dependence of a resistor in a semiconductor integrated circuit is given by a physical property of a resistive material. Consequently, since a voltage to be applied across two ends of a constant current generating resistor must correspond to temperature dependence of the constant current generating resistor, a voltage value can not be changed freely. In other words, since the voltage to be applied across the two ends of the constant current generating resistor is restricted by conditions for reducing temperature dependence of the constant current, an absolute value of the constant current can not be increased/decreased by changing the voltage value.

For this reason, a resistance value of the constant current generating resistor must be increased/decreased for changing the absolute value of the constant current. For example, a resistor element having a resistance value of 1/10 must be prepared in a case of increasing the absolute value of the constant current by 10 times. In contrast, a resister element having a resistance value of 10 times must be prepared in a case of decreasing the absolute value of the constant current to 1/10.

In the case of preparing the resistor element having the resistance value of 1/10, a width of the resistor element must be enlarged by 10 times while a length thereof is fixed. In the case of preparing the resistor element having the resistance value of 10 times, on the other hand, a length of the resistor element must be enlarged by 10 times while a width thereof is fixed. In any cases, as described above, there arises a problem that an occupied area of the resistor element is increased disadvantageously.

In addition, if a new manufacturing process is added to a manufacturing step in order to obtain separate resistor elements different in resistance value per unit length or unit width from each other, there arises a problem of increase in manufacturing cost.

In order to reduce an amount of electric current to be consumed by the semiconductor integrated circuit, a resistor to be used in the band gap reference voltage circuit has a large resistance value. As a result, a phase allowance of the band gap reference voltage circuit is lowered, resulting in deterioration of stability of an output from the band gap reference voltage circuit. In order to secure the stability of the output, a phase compensation circuit having a strength must be added to the band gap reference voltage circuit. As a result, a capacity in the phase compensation circuit becomes large in value, which causes a problem that a circuit occupied area is increased.

However, constant current generation circuit 6 in the semiconductor device according to the embodiment of the present invention has the configuration that the current value of constant current IREF0N is adjusted by adjustment of the combined channel length of the MOS transistors in resistor unit RU1. Therefore, this configuration allows reduction in circuit occupied area as compared with the above-described configuration using the constant current generating resistor and the band gap reference voltage circuit.

In constant current generation circuit 6, further, it is possible to readily obtain a minute constant current of several tens of nanoamperes. Therefore, it is possible to readily generate a low-speed oscillation signal at several hundreds of kilohertz when this constant current is used for frequency/voltage conversion.

Figure 3:
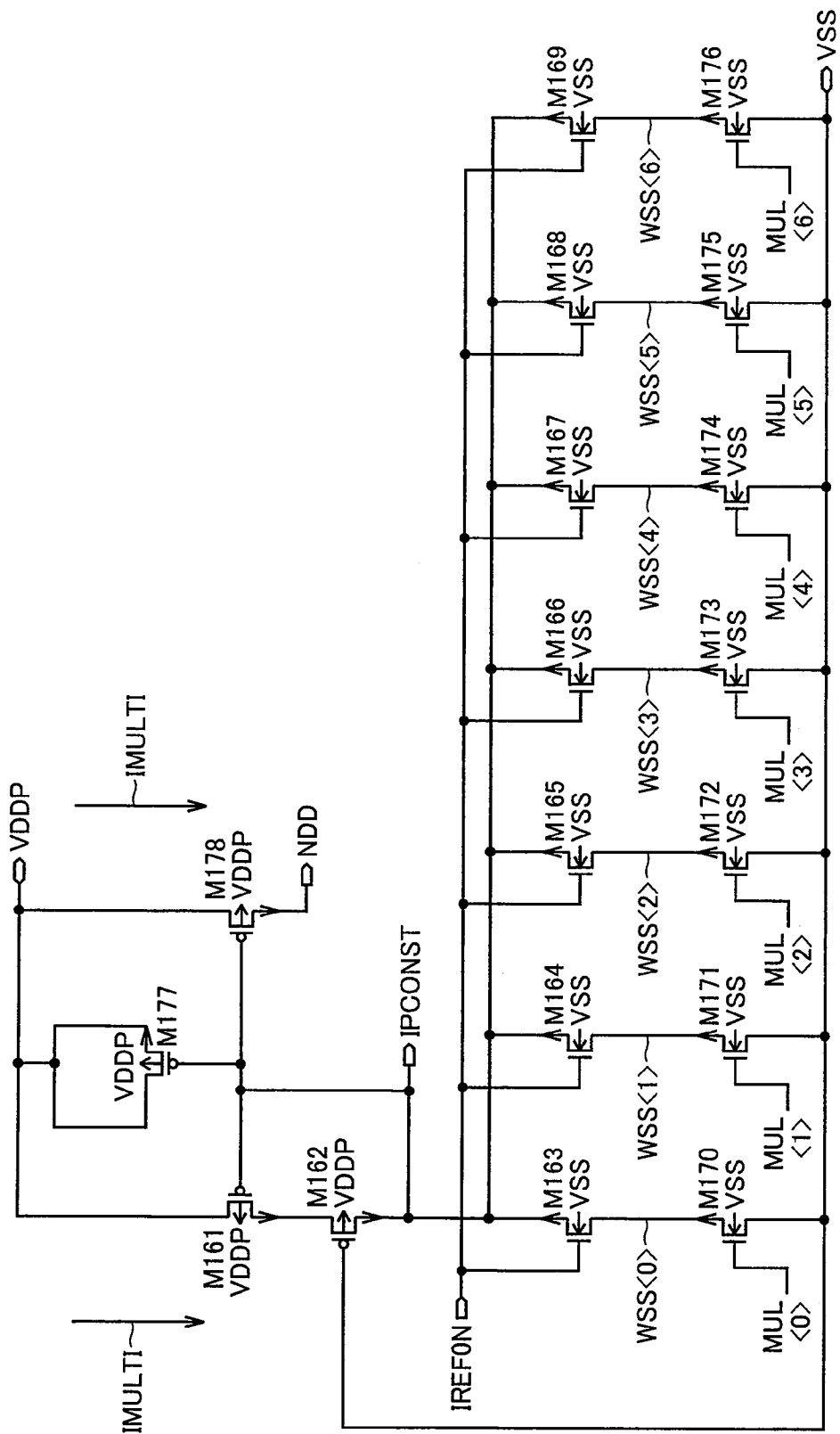
FIG. 3 shows a circuit diagram of a configuration of a constant current amplification circuit 7 in the semiconductor device according to the embodiment of the present invention.

FIG. 3 shows a circuit diagram of a configuration of constant current amplification circuit 7 in the semiconductor device according to the embodiment of the present invention.

With reference to FIG. 3, constant current amplification circuit 7 includes N-channel MOS transistors M163 to M176, P-channel MOS transistors M161, M162 and M178, and a P-channel MOS transistor (a MOS capacitor) M177.

N-channel MOS transistors M163 to M169 have gates connected to node IREF0N, drains connected to a node IPCONST, and sources connected to drains of N-channel MOS transistors M170 to M176 through nodes WSS<0> to WSS<6>, respectively.

N-channel MOS transistors M170 to M176 have gates receiving current doubling and trimming signals MUL<0> to MUL<6>, respectively, and sources connected to ground node VSS.

P-channel MOS transistor M162 has a gate connected to ground node VSS, a drain connected to node IPCONST, and a source connected to a drain of P-channel MOS transistor M161. Gates of P-channel MOS transistors M161, M177 and M178 are connected to node IPCONST. Sources of P-channel MOS transistors M161 and M178, and a drain and a source of P-channel MOS transistor M177 are connected to power supply node VDDP. A drain of P-channel MOS transistor M178 is connected to a node NDD.

N-channel MOS transistors M163 to M169 form a current mirror circuit through node IREF0N in conjunction with N-channel MOS transistor M19 in constant current generation circuit 6.

N-channel MOS transistors M170 to M176 are connected between ground node VSS and N-channel MOS transistors M163 to M169, respectively. N-channel MOS transistors M170 to M176 switch a connection state and a disconnection state between the corresponding N-channel MOS transistor and ground node VSS, based on externally received current doubling and trimming signals MUL<0> to MUL<6>, thereby changing a mirror ratio of the current mirror circuit. Thus, a current value of constant current IMULTI is changed.

P-channel MOS transistor M162 is in an ON state constantly during a period that semiconductor device 101 becomes conductive, that is, a period that semiconductor device 101 is supplied with power supply voltage VDD and ground voltage VSS. Therefore, the gate and the drain of P-channel MOS transistor M161 are equal in potential to each other constantly during the period that semiconductor device 101 becomes conductive. Accordingly, P-channel MOS transistor M161 and P-channel MOS transistor M178 form a current mirror circuit. Thus, constant current IMULTI is outputted to node NDD through P-channel MOS transistor M178.

Moreover, a voltage IPCONST corresponding to constant current IMULTI is supplied to node IPCONST to which the gate of P-channel MOS transistor M161 and the gate of P-channel MOS transistor M178 are connected.

With this configuration, the current value of the constant current used for the charge by frequency/voltage conversion circuit 2 can be amplified to an integral multiple or a fractional multiple of constant current IREF0N outputted from constant current generation circuit 6. Therefore, the current value of the constant current used for the charge by frequency/voltage conversion circuit 2 can be set within a wide range. In the semiconductor device according to the embodiment of the present invention, accordingly, it is possible to set a frequency of oscillation signal CKX within a wide range up to several tens of megahertz at maximum on a high speed side, for example.

In constant current generation circuit 6 and constant current amplification circuit 7, accordingly, various frequencies within a wide range from several hundreds of kilohertz to several tens of megahertz can be set as the frequency of the oscillation signal only by change in reference current value adjustment signals TRIMCHR and current doubling and trimming signals MUL. That is, various oscillation frequencies can be selected without requiring a structure that a plurality of on-chip oscillator circuits are mounted on a semiconductor chip. Therefore, it is possible to prevent increase in area of the semiconductor chip and increase in cost of the semiconductor device.

Figure 4:
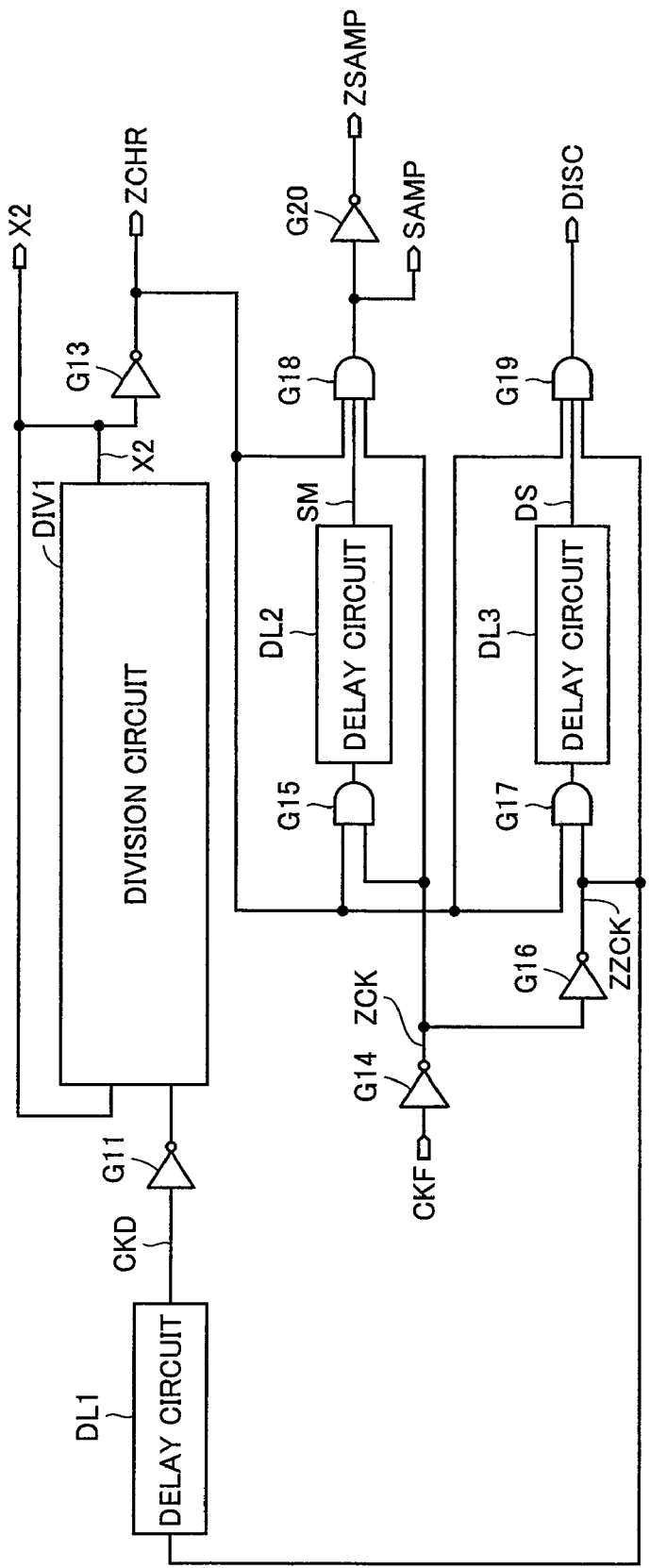
FIG. 4 shows a circuit diagram of a configuration of a conversion control circuit 1 in the semiconductor device according to the embodiment of the present invention.
Figure 5:
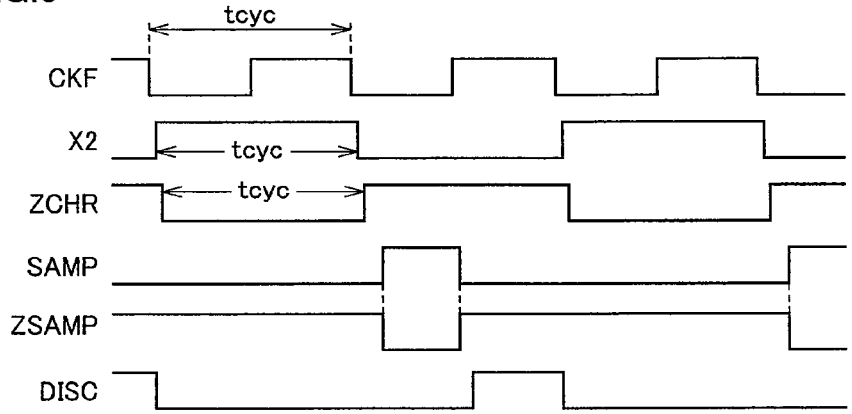
FIG. 5 shows a time chart of operations of conversion control circuit 1 in the semiconductor device according to the embodiment of the present invention.

FIG. 4 shows a circuit diagram of a configuration of conversion control circuit 1 in the semiconductor device according to the embodiment of the present invention. FIG. 5 shows a time chart of operations of conversion control circuit 1 in the semiconductor device according to the embodiment of the present invention.

With reference to FIG. 4, conversion control circuit 1 includes delay circuits DL1, DL2 and DL3, division circuit DIV1, NOT gates G11, G13, G14, G16 and G20, 2-input AND gates G15 and G17, and 3-input AND gates G18 and G19.

With reference to FIG. 5, conversion control circuit 1 generates timing signals ZCHR, SAMP, ZSAMP and DISC for allowing frequency/voltage conversion circuit 2 to perform one frequency/voltage converting operation at every two cycles of oscillation signal CKF outputted from voltage control and oscillation circuit 5.

More specifically, NOT gate G14 inverts a logic level of oscillation signal CKF received from voltage control and oscillation circuit 5, and outputs the resultant signal as an oscillation signal ZCK. NOT gate G16 inverts a logic level of oscillation signal ZCK received from NOT gate G14, and outputs the resultant signal as an oscillation signal ZZCK.

Delay circuit DL1 delays oscillation signal ZZCK received from NOT gate G16, and outputs the resultant signal as an oscillation signal CKD to NOT gate G11. It is to be noted that a delay amount of delay circuit DL1 is smaller than those of delay circuits DL2 and DL3. NOT gate G11 inverts a logic level of oscillation signal CKD received from delay circuit DL1, and outputs the resultant signal to division circuit DIV1.

Division circuit DIV1 divides the oscillation signal received from NOT gate G11 into two, and outputs the resultant signal as division signal X2 to division circuit 9.

NOT gate G13 inverts a logic level of division signal X2 received from division circuit DIV1, and outputs the resultant signal as timing signal ZCHR to frequency/voltage conversion circuit 2.

2-input AND gate G15 outputs to delay circuit DL2 an AND of timing signal ZCHR received from NOT gate G13 and oscillation signal ZCK received from NOT gate G14.

Delay circuit DL2 delays the signal received from 2-input AND gate G15, and outputs the resultant signal as a signal SM to 3-input AND gate G18.

3-input AND gate G18 outputs to frequency/voltage conversion circuit 2 an AND of timing signal ZCHR received from NOT gate G13, signal SM received from delay circuit DL2 and oscillation signal ZCK received from NOT gate G14, as timing signal SAMP.

NOT gate G20 inverts a logic level of timing signal SAMP received from 3-input AND gate G18, and outputs the resultant signal as timing signal ZSAMP to frequency/voltage conversion circuit 2.

2-input AND gate G17 outputs to delay circuit DL3 an AND of timing signal ZCHR received from NOT gate G13 and oscillation signal ZZCK received from NOT gate G16.

Delay circuit DL3 delays the signal received from 2-input AND gate G17, and outputs the resultant signal as a signal DS to 3-input AND gate G19.

3-input AND gate G19 outputs to frequency/voltage conversion circuit 2 an AND of timing signal ZCHR received from NOT gate G13, signal DS received from delay circuit DL3 and oscillation signal ZZCK received from NOT gate G16, as timing signal DISC.

With this configuration, conversion control circuit 1 generates timing signal ZCHR used for performing the frequency/voltage converting operation, at one of half cycles (herein, a period at a logic high level) of division signal X2 obtained by dividing oscillation signal CKF into two. Moreover, conversion control circuit 1 generates timing signals SAMP and ZSAMP used for transferring voltage VSIG obtained by the frequency/voltage conversion to averaging circuit 11, that is, used for transferring control voltage WSIG to analog integration circuit 3, at the other one of the half cycles (herein, a period at a logic low level) of division signal X2. Further, conversion control circuit 1 generates timing signal DISC used for initializing the frequency/voltage converting operation after control voltage WSIG is transferred to analog integration circuit 3. It is to be noted that the half cycle of division signal X2 corresponds with a cycle tcyc of oscillation signal CKF.

Herein, a time ratio between the logic high level and the logic low level in oscillation signal CKF is not necessarily constant. Consequently, if the frequency/voltage converting operation is performed at a half cycle of oscillation signal CKF, oscillation signal CKF becomes deteriorated in frequency accuracy. However, conversion control circuit 1 in the semiconductor device according to the embodiment of the present invention generates timing signal ZCHR used for performing the frequency/voltage converting operation at one of the half cycles of division signal X2 having a duty ratio of 1 with certainty. With this configuration, it is possible to enhance the frequency accuracy of oscillation signal CKF. It is to be noted that conversion control circuit 1 may be configured to generate timing signal ZCHR which is set at the logic low level at a plurality of cycles of oscillation signal CKF, that is, timing signal ZCHR used for performing the frequency/voltage converting operation at a plurality of cycles of oscillation signal CKF.

In conversion control circuit 1, moreover, a hold-off time can be inserted before or after a timing that the logic level of timing signal ZCHR is shifted and before or after a timing that timing signals SAMP and DISC are set at the logic high level, by a delay circuit and a logic circuit. With this configuration, it is possible to operate frequency/voltage conversion circuit 2 correctly.

Figure 6:
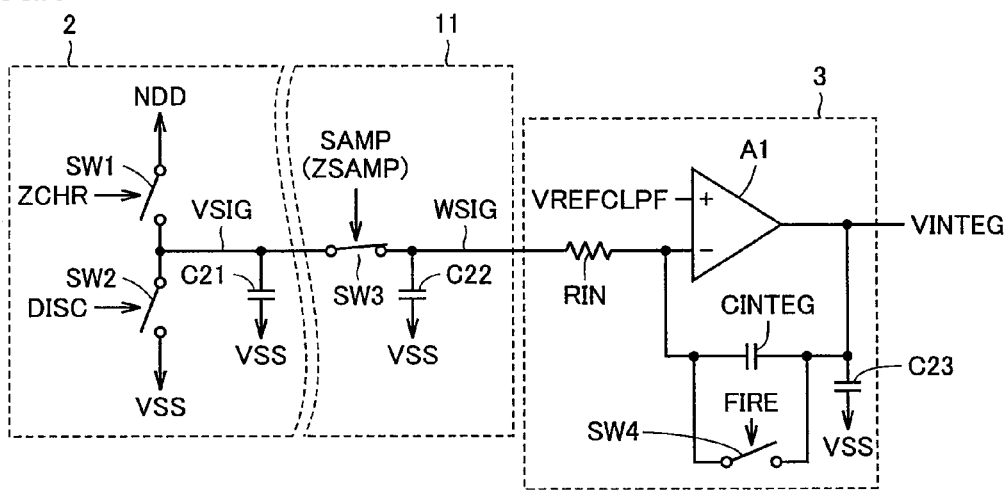
FIG. 6 shows schematic configurations of a frequency/voltage conversion circuit 2, an averaging circuit 11 and an analog integration circuit 3 in the semiconductor device according to the embodiment of the present invention.
Figure 7:
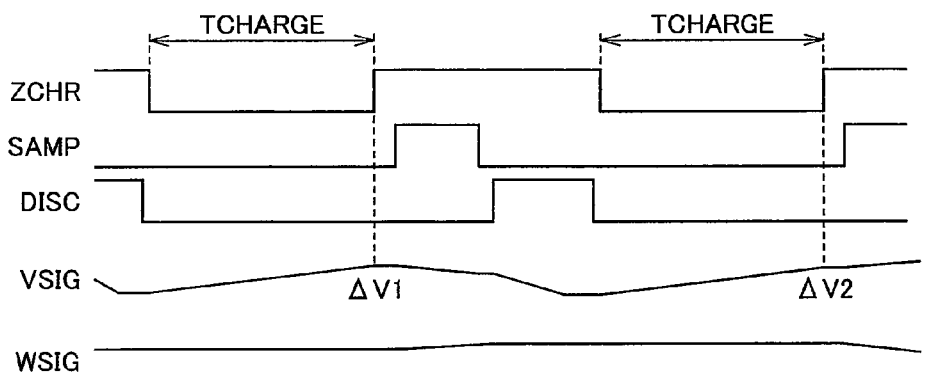
FIG. 7 shows a time chart of operations of frequency/voltage conversion circuit 2 in the semiconductor device according to the embodiment of the present invention.

FIG. 6 shows schematic configurations of frequency/voltage conversion circuit 2, averaging circuit 11 and analog integration circuit 3 in the semiconductor device according to the embodiment of the present invention. FIG. 7 shows a time chart of operations of frequency/voltage conversion circuit 2 in the semiconductor device according to the embodiment of the present invention.

With reference to FIG. 6, frequency/voltage conversion circuit 2 includes switches SW1 and SW2, and a capacitor C21. Averaging circuit 11 includes a switch SW3 and a capacitor C22. Analog integration circuit 3 includes a differential amplifier A1, an integration capacitor CINTEG, a switch SW4, an input resistor RIN and a capacitor C23.

In frequency/voltage conversion circuit 2, switch SW1 has a first end connected to node NDD supplied with constant current IMULTI, and a second end connected to a node VSIG. Switch SW2 has a first end connected to node VSIG, and a second end connected to ground node VSS. Capacitor C21 has a first end connected to node VSIG, and a second end connected to ground node VSS.

In analog integration circuit 3, switch SW3 has a first end connected to node VSIG, and a second end connected to a node WSIG. Capacitor C22 has a first end connected to node WSIG, and a second end connected to ground node VSS.

Capacitor C22 is equal in capacitance value to capacitor C21, for example. Switch SW3 switches a connection state and a disconnection state between capacitor C21 and capacitor C22.

In analog integration circuit 3, input resistor RIN has a first end connected to node WSIG, and a second end. Integration capacitor CINTEG has a first end connected to the second end of input resistor RIN, and a second end. Differential amplifier A1 has a non-inverting input terminal receiving a changeable reference voltage VREFCLPF, an inverting input terminal connected to the second end of input resistor RIN, and an output terminal connected to the second end of integration capacitor CINTEG. Capacitor C23 has a first end connected to the output terminal of differential amplifier A1, and a second end connected to ground node VSS. Switch SW4 has a first end connected to the first end of integration capacitor CINTEG, and a second end connected to the second end of integration capacitor CINTEG.

Frequency/voltage conversion circuit 2 converts the frequency of oscillation signal CKF outputted from voltage control and oscillation circuit 5 into the voltage, and outputs the voltage as conversion voltage VSIG to node VSIG.

With reference to FIGS. 6 and 7, more specifically, in frequency/voltage conversion circuit 2, switch SW2 is closed during a period that timing signal DISC from conversion control circuit 1 is at the logic high level, thereby discharging an electric charge from capacitor C21.

Then, switch SW1 is closed during a period TCHARGE that timing signal ZCHR from conversion control circuit 1 is at the logic low level, that is, in a time width of cycle tcyc of oscillation signal CKF, thereby charging capacitor C21 with constant current IMULTI received from constant current amplification circuit 7 through node NDD. Thus, one frequency/voltage converting operation is completed.

Herein, when the current value of constant current IMULTI is represented by IMULTI and the capacitance value of capacitor C21 is represented by C, a charged voltage V of capacitor C21 is given by an expression, IMULTI×tcyc/C. Moreover, frequency f of oscillation signal CKF is given by an expression, f=1/tcyc; therefore, charged voltage V of capacitor C21 is given by an expression, IMULTI/(C×f).

Herein, the current value of constant current IREF0N and the capacitance value of capacitor C21 are determined at the time of manufacturing semiconductor device 101. Therefore, since charged voltage V is proportional to cycle tcyc, frequency f of oscillation signal CKF can be obtained from charged voltage V.

Next, switch SW3 in averaging circuit 11 is closed during a period that timing signal SAMP from conversion control circuit 1 is at the logic high level, thereby averaging conversion voltage VSIG obtained at this time by frequency/voltage conversion circuit 2, that is, the voltage corresponding to the electric charge accumulated in capacitor C21 and control voltage WSIG outputted from averaging circuit 11 to analog integration circuit 3 at the previous time, that is, the voltage corresponding to the electric charge accumulated in capacitor C22.

Then, switch SW3 is opened when timing signal SAMP from conversion control circuit 1 is set at the logic low level, thereby electrically disconnecting node VSIG and node WSIG from each other.

Then, when timing signal DISC from conversion control circuit 1 is set at the logic high level, the electric charge is discharged from node VSIG as described above. However, since switch SW3 is opened, no electric charge is discharged from capacitor C22. Accordingly, the voltage value of control voltage WSIG outputted from analog integration circuit 3 is maintained.

Next, analog integration circuit 3 integrates control voltage WSIG received from averaging circuit 11 to generate control voltage VINTEG, and outputs control voltage VINTEG to bias voltage generation circuit 4.

More specifically, differential amplifier A1 has the non-inverting input terminal receiving reference voltage VREFCLPF, and the inverting input terminal receiving control voltage WSIG through input resistor RIN. Integration capacitor CINTEG is connected between the non-inverting input terminal and the output terminal in differential amplifier A1.

Therefore, when a time function of control voltage VINTEG which is the output voltage from differential amplifier A1 is represented by VINTEG(t), a resistance value of input resistor RIN is represented by Rin, a capacitance value of integration capacitor CINTEG is represented by Cinteg, a voltage value of reference voltage VREFCLPF is represented by VREFC and a time function of control voltage WSIG is represented by WSIG(t), the following expression is satisfied.

$$VINTEG(t) - VINTEG(0) = -1/(Rin \times Cinteg) \times \int_0^t [WSIG(\tau) \times VREFC] d\tau$$

That is, when control voltage WSIG increases, the integrated function, [WSIG(τ)×VREFC], takes a positive value, so that control voltage VINTEG decreases. On the other hand, when control voltage WSIG decreases, the integrated function, [WSIG(τ)×VREFC], takes a negative value, so that control voltage VINTEG increases.

Herein, the integrated function, [WSIG(τ)×VREFC], has a maximum value which is equal to a value of a power supply voltage to be fed to a circuit at most, for example, several volts in recent LSI. The semiconductor device according to the embodiment of the present invention adjusts resistance value Rin of input resistor RIN and capacitance value of Cinteg of integration capacitor CINTEG, thereby setting the time constant for integration of control voltage WSIG at a long time. Thus, it is possible to achieve gentle change of control voltage VINTEG (VINTEG(t)−VINTEG(0)).

In the semiconductor device according to the embodiment of the present invention, switch SW3 is provided on a stage subsequent to frequency/voltage conversion circuit 2, and capacitor C22 is provided on a stage subsequent to switch SW3. Then, switch SW3 is opened/closed appropriately, so that an arrival potential at node WSIG by every frequency/voltage converting operation performed by frequency/voltage conversion circuit 2 is "constantly" held at capacitor C22. Moreover, analog integration circuit 3 is directly connected to a stage subsequent to capacitor C22. With this configuration, it is possible to suppress rapid change in control voltage WSIG to be outputted to analog integration circuit 3.

It is to be noted that the semiconductor device according to the embodiment of the present invention has the configuration that averaging circuit 11 averages conversion voltage VSIG and control voltage WSIG generated previously, but is not limited thereto. For example, the semiconductor device according to the embodiment of the present invention may have a configuration that a new control voltage WSIG having a level between that of conversion voltage VSIG and that of control voltage WSIG generated previously is generated and, then, is outputted to analog integration circuit 3.

Moreover, each constant of components in analog integration circuit 3 is set such that the time constant determined by input resistor RIN and integration capacitor CINTEG becomes several tens of times to several hundreds of times as large as the cycle of oscillation signal CKF.

With this configuration, a result of frequency/voltage conversion is integrated and averaged over a long period of time from several tens of times to several hundreds of times as large as the cycle of oscillation signal CKF. Thus, control voltage VINTEG can be set at an analog voltage changed considerably gently with respect to a time axis. Then, oscillation signal CKF is generated based on this analog voltage, so that an operation required as an oscillator can be performed satisfactorily.

Therefore, a rapid response is not necessarily required to analog integration circuit 3, leading to reduction in amount of electric current to be consumed by analog integration circuit 3. That is, it is possible to achieve reduction in power consumption by the semiconductor device only by addition of averaging circuit 11 having a simple configuration including only a capacitor and a switch.

In addition, the semiconductor device according to the embodiment of the present invention integrates the arrival potential at node WSIG by every frequency/voltage converting operation performed by frequency/voltage conversion circuit 2 over a long period of time, and averages a result of the integration. With this configuration, it is possible to average discrete spike noise from an inside or an outside of the semiconductor device. Therefore, it is possible to achieve resistance to such discrete noise and to realize a highly accurate oscillating operation.

Moreover, the semiconductor device according to the embodiment of the present invention adjusts reference voltage VREFCLPF to change control voltage VINTEG, thereby adjusting the analog bias of voltage control and oscillation circuit 5. Thus, it is possible to slightly adjust the frequency of oscillation signal CKF and, therefore, to enhance the frequency accuracy of oscillation signal CKF.

Figure 8:
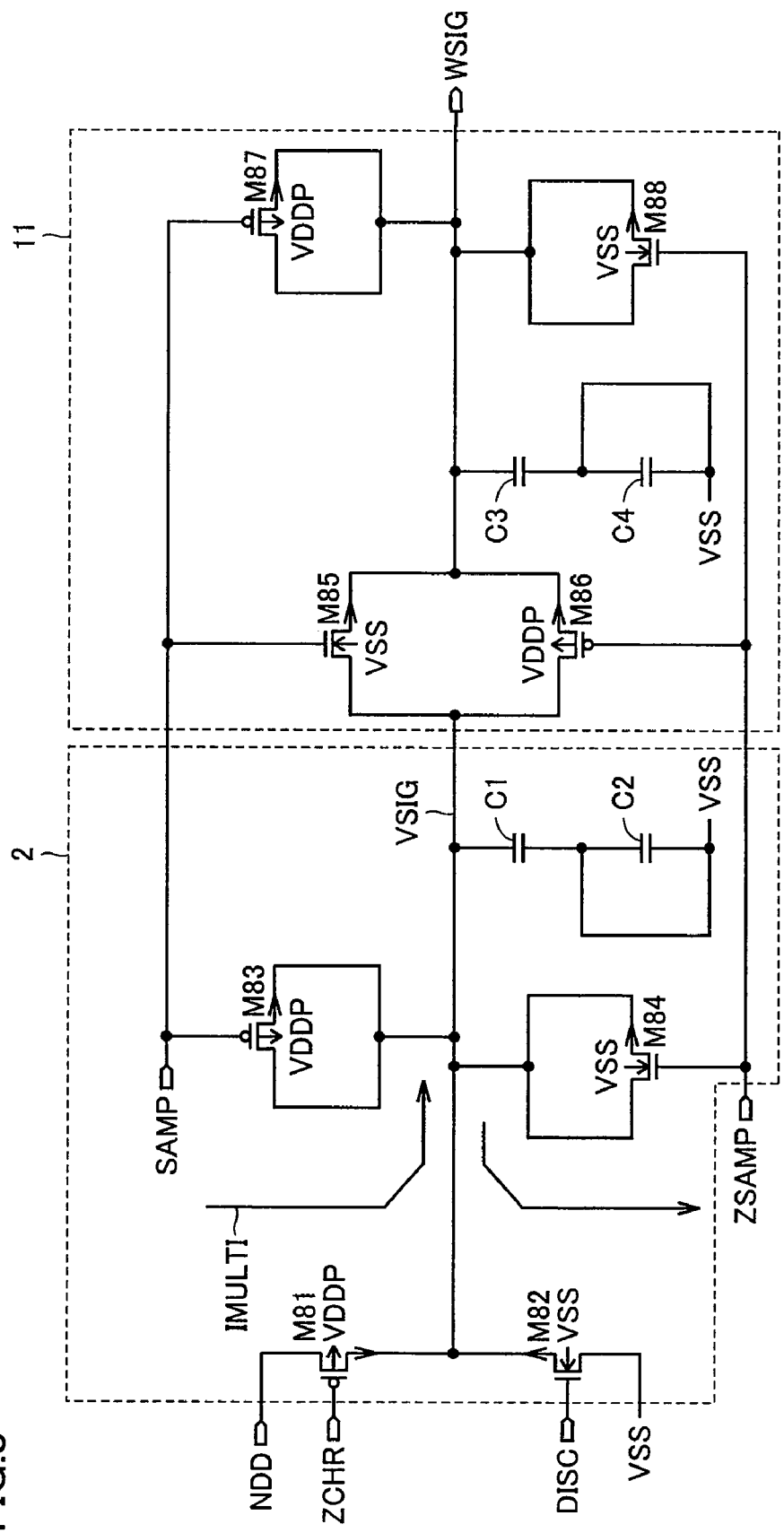
FIG. 8 shows a circuit diagram of the configurations of frequency/voltage conversion circuit 2 and averaging circuit 11 in the semiconductor device according to the embodiment of the present invention.

FIG. 8 shows a circuit diagram of the configurations of frequency/voltage conversion circuit 2 and averaging circuit 11 in the semiconductor device according to the embodiment of the present invention.

With reference to FIG. 8, frequency/voltage conversion circuit 2 includes an N-channel MOS transistor M82, a P-channel MOS transistor M81, an N-channel MOS transistor (a MOS capacitor) M84, a P-channel MOS transistor (a MOS capacitor) M83, and capacitors C1 and C2. Averaging circuit 11 includes an N-channel MOS transistor M85, a P-channel MOS transistor M86, an N-channel MOS transistor (a MOS capacitor) M87, a P-channel MOS transistor (a MOS capacitor) M88, and capacitors C3 and C4.

P-channel MOS transistor M81 corresponds to switch SW1 shown in FIG. 6. N-channel MOS transistor M82 corresponds to switch SW2 shown in FIG. 6. N-channel MOS transistor M85 and P-channel MOS transistor M86 correspond to switch SW3 shown in FIG. 6. Capacitors C1 and C2 correspond to capacitor C21 shown in FIG. 6. Capacitors C3 and C4 correspond to capacitor C22 shown in FIG. 6.

P-channel MOS transistor M81 has a gate connected to node ZCHR, and a source connected to node NDD.

A drain of P-channel MOS transistor M81, a drain of N-channel MOS transistor M82, a drain and a source of P-channel MOS transistor M83, a drain and a source of N-channel MOS transistor M84, a first end of capacitor C1, a drain of N-channel MOS transistor M85, and a source of P-channel MOS transistor M86 are connected to node VSIG.

A source of N-channel MOS transistor M85, a drain of P-channel MOS transistor M86, a first end of capacitor C3, a drain and a source of P-channel MOS transistor M87, and a drain and a source of N-channel MOS transistor M88 are connected to node WSIG.

A gate of P-channel MOS transistor M83, a gate of N-channel MOS transistor M85, and a gate of P-channel MOS transistor M87 are connected to node SAMP. Gates of N-channel MOS transistors M84 and M88 are connected to node ZSAMP.

A source of N-channel MOS transistor M82, second ends of capacitors C1 and C3, and first and second ends of capacitors C2 and C4 are connected to ground node VSS.

Figure 9:
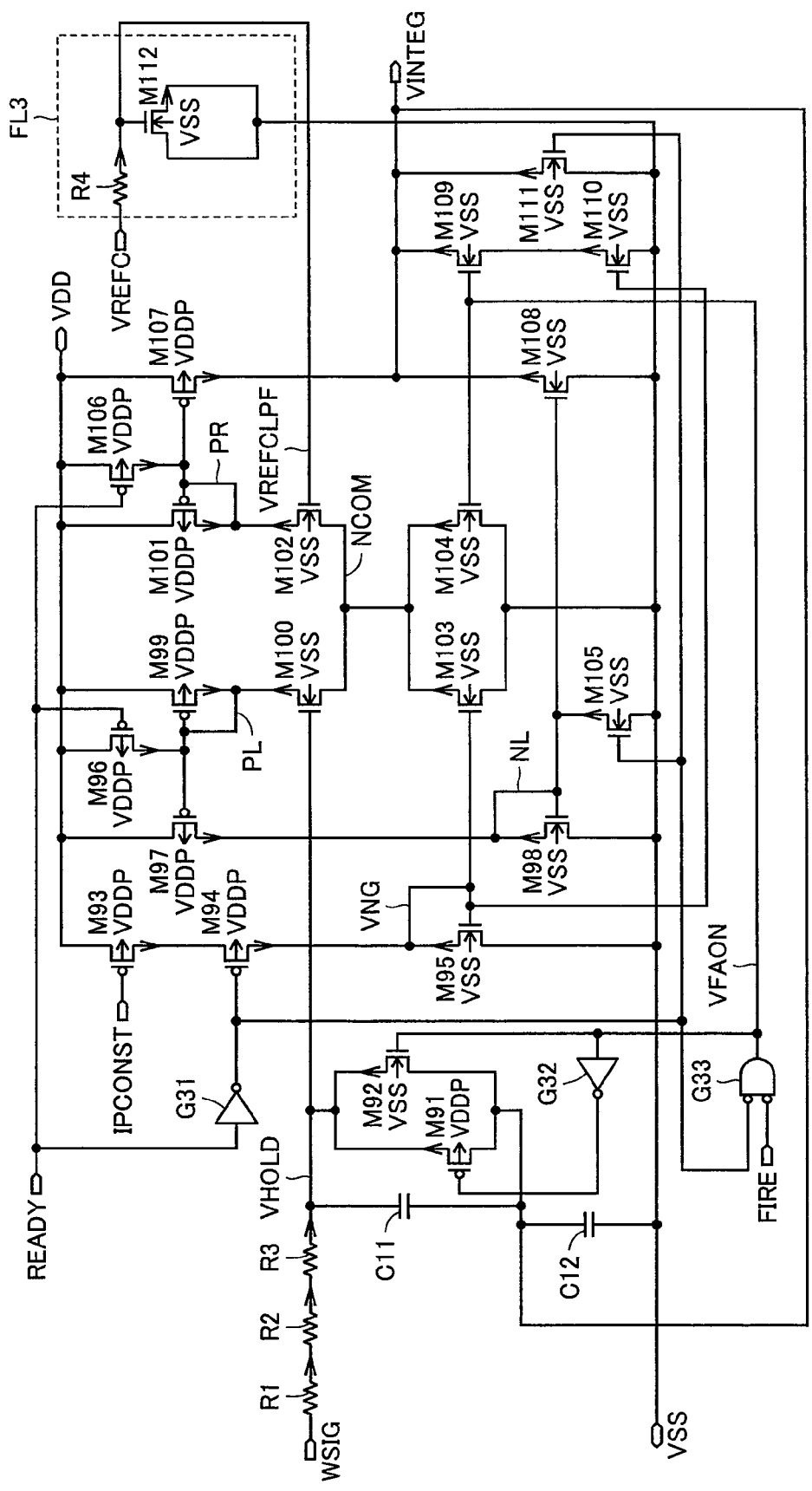
FIG. 9 shows a circuit diagram of the configuration of analog integration circuit 3 in the semiconductor device according to the embodiment of the present invention.

FIG. 9 shows a circuit diagram of the configuration of analog integration circuit 3 in the semiconductor device according to the embodiment of the present invention.

With reference to FIG. 9, analog integration circuit 3 includes resistors R1 to R3, N-channel MOS transistors M92, M95, M100, M102 to M105 and M108 to M111, P-channel MOS transistors M93, M94, M96 to M99, M101, M106 and M107, an N-channel MOS transistor (a MOS capacitor) M112, capacitors C11 and C12, NOT gates G31 and G32, and an AND gate G33.

Resistors R1 to R3 correspond to input resistor RIN shown in FIG. 6. Capacitor C11 corresponds to integration capacitor CINTEG shown in FIG. 6. Capacitor C12 corresponds to capacitor C23 shown in FIG. 6. N-channel MOS transistors M100 and M102 to M104 and P-channel MOS transistors M99 and M101 correspond to differential amplifier A1 shown in FIG. 6.

Resistor R1 has a first end connected to node WSIG, and a second end connected to a first end of resistor R2. Resistor R2 has a second end connected to a first end of resistor R3.

A second end of resistor R3, a first end of capacitor C11, a source of P-channel MOS transistor M91, a drain of N-channel MOS transistor M92, and a gate of N-channel MOS transistor M100 are connected to a node VHOLD.

A gate of P-channel MOS transistor M94, a first input terminal of AND gate G33, and gates of N-channel MOS transistors M105 and M111 are connected to an output terminal of NOT gate G31.

P-channel MOS transistor M93 has a gate connected to node IPCONST, and a drain connected to a source of P-channel MOS transistor M94. A drain of P-channel MOS transistor M94, a drain and a gate of N-channel MOS transistor M95, and gates of N-channel MOS transistors M103 and M110 are connected to a node VNG.

A source of P-channel MOS transistor M97, a drain and a gate of N-channel MOS transistor M98, a drain of N-channel MOS transistor M105, and a gate of N-channel MOS transistor M108 are connected to a node NL.

A gate of P-channel MOS transistor M97, a drain of P-channel MOS transistor M96, a gate and a drain of P-channel MOS transistor M99, and a drain of N-channel MOS transistor M100 are connected to a node PL.

A gate of P-channel MOS transistor M107, a drain of P-channel MOS transistor M106, a gate and a drain of P-channel MOS transistor M101, and a drain of N-channel MOS transistor M102 are connected to a node PR.

Sources of N-channel MOS transistors M100 and M102, and drains of N-channel MOS transistors M103 and M104 are connected to node NCOM. A gate of N-channel MOS transistor M102, a first end of resistor R4, and a gate of N-channel MOS transistor M112 are connected to node VREFCLPF.

A gate of N-channel MOS transistor M104, a gate of N-channel MOS transistor M109, and an output terminal of AND gate G33 are connected to a node VFAON.

A second input terminal of AND gate G33 is connected to a node FIRE. An input terminal of NOT gate G31, and gates of P-channel MOS transistors M96 and M106 are connected to a node READY. A first end of resistor R4 is connected to a node VREFC.

A second end of capacitor C11, a first end of capacitor C12, a drain of P-channel MOS transistor M91, a source of N-channel MOS transistor M92, a drain of P-channel MOS transistor M107, and drains of N-channel MOS transistors M108, M109 and M111 are connected to node VINTEG.

Sources of P-channel MOS transistors M93, M96, M99, M101, M106 and M107 are connected to power supply node VDD. Sources of N-channel MOS transistors M95, M98, M105, M108, M110 and M111, and a drain and a source of N-channel MOS transistor M112 are connected to ground node VSS.

When each of control signal READY and control signal FIRE is set at the logic high level, analog integration circuit 3 starts to perform the integrating operation.

Filter FL3 removes a noise component from externally received reference voltage VREFC, and outputs the resultant voltage as reference voltage VREFCLPF to the gate of N-channel MOS transistor M102.

Moreover, the voltage at node IPCONST of constant current amplification circuit 7 is supplied to the gate of P-channel MOS transistor M93. Therefore, a tail current from differential amplifier A1, that is, an electric current flowing from node NCOM into ground node VSS through N-channel MOS transistor M103 or M104 is proportional to constant current IMULTI generated by constant current amplification circuit 7.

With this configuration, in order to generate an oscillation signal CKF in a high frequency, the tail current from differential amplifier A1 can be set at a relatively large value such as several tens of microamperes. On the other hand, in order to generate an oscillation signal CKF in a low frequency, the tail current from differential amplifier A1 can be set at a relatively small value such as several microamperes. In other words, the tail current from differential amplifier A1 can be automatically set in accordance with the range of the frequency of oscillation signal CKF in an appropriate manner, leading to reduction in power consumption by the semiconductor device.

Figure 10:
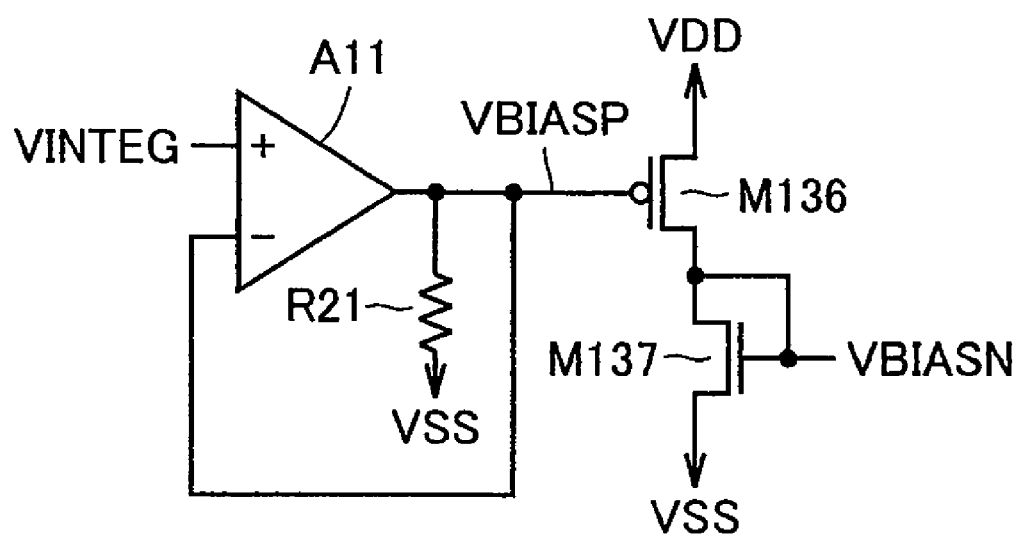
FIG. 10 shows a schematic configuration of a bias voltage generation circuit 4 in the semiconductor device according to the embodiment of the present invention.

FIG. 10 shows a schematic configuration of bias voltage generation circuit 4 in the semiconductor device according to the embodiment of the present invention.

With reference to FIG. 10, bias voltage generation circuit 4 includes a differential amplifier A11, an N-channel MOS transistor M137, a P-channel MOS transistor M136 and a pull-down resistor R21.

Differential amplifier A11 has a non-inverting input terminal receiving control voltage VINTEG from analog integration circuit 3, and an inverting input terminal and an output terminal connected to each other. That is, differential amplifier A11 forms a voltage follower circuit. Differential amplifier A11 receives control voltage VINTEG from bias voltage generation circuit 4, and outputs bias voltage VBIASP to each of voltage control and oscillation circuit 5 and P-channel MOS transistor M136.

P-channel MOS transistor M136 has a gate receiving bias voltage VBIASP, a source connected to power supply node VDD, and a drain connected to a drain of N-channel MOS transistor M137.

N-channel MOS transistor M137 has the drain and a gate connected to each other, and a source connected to ground node VSS. A voltage at each of the drain and the gate of N-channel MOS transistor M137 is outputted as bias voltage VBIASN to voltage control and oscillation circuit 5. Moreover, pull-down resistor R21 pulls down the output from differential amplifier A11.

Figure 11:
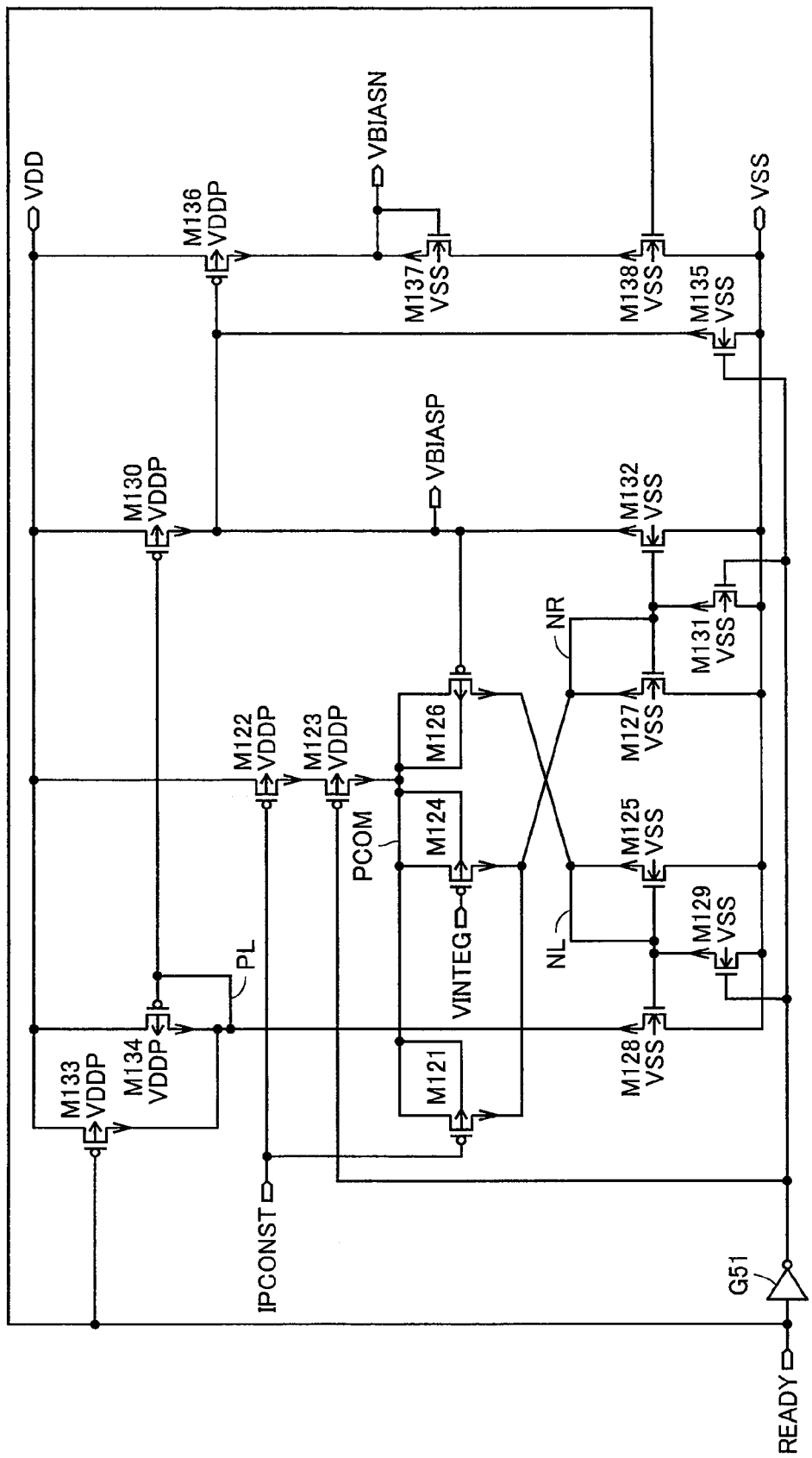
FIG. 11 shows a circuit diagram of the configuration of bias voltage generation circuit 4 in the semiconductor device according to the embodiment of the present invention.

FIG. 11 shows a circuit diagram of the configuration of bias voltage generation circuit 4 in the semiconductor device according to the embodiment of the present invention.

With reference to FIG. 11, bias voltage generation circuit 4 includes N-channel MOS transistors M125, M127, M128, M129, M131, M132, M135, M137 and M138, P-channel MOS transistors M121 to M124, M126, M130, M133, M134 and M136, and a NOT gate G51.

N-channel MOS transistors M125, M127, M128, M129, M131 and M132, and P-channel MOS transistors M122 to M124, M126, M130 and M134 correspond to differential amplifier A11 shown in FIG. 10. N-channel MOS transistor M121 corresponds to pull-down resistor R21 shown in FIG. 10.

Gates of P-channel MOS transistors M121 and M122 are connected to node IPCONST. Sources and wells of P-channel MOS transistors M121, M124 and M126, and a drain of P-channel MOS transistor M123 are connected to node PCOM. A drain of P-channel MOS transistor M122 and a source of P-channel MOS transistor M123 are connected to each other. A gate of P-channel MOS transistor M124 is connected to node VINTEG.

A drain of P-channel MOS transistor M121, a drain of P-channel MOS transistor M124, a drain and a gate of N-channel MOS transistor M127, a drain of N-channel MOS transistor M131, and a gate of N-channel MOS transistor M132 are connected to a node NR.

A drain of P-channel MOS transistor M126, a drain and a gate of N-channel MOS transistor M125, a drain of N-channel MOS transistor M129, and a gate of N-channel MOS transistor M128 are connected to gate NL.

A gate and a drain of P-channel MOS transistor M134, a drain of P-channel MOS transistor M133, a gate of P-channel MOS transistor M130, and a drain of N-channel MOS transistor M128 are connected to node PL.

A drain of P-channel MOS transistor M130, a gate of P-channel MOS transistor M126, drains of N-channel MOS transistors M132 and M135, and a gate of P-channel MOS transistor M136 are connected to node VBIASP. A drain of P-channel MOS transistor M136, and a drain and a gate of N-channel MOS transistor M137 are connected to node VBIASN. A source of N-channel MOS transistor M137 is connected to a drain of N-channel MOS transistor M138.

An input terminal of NOT gate G51, a gate of P-channel MOS transistor M133, and a gate of N-channel MOS transistor M138 are connected to node READY. A gate of P-channel MOS transistor M123, and gates of N-channel MOS transistors M129, M131 and M135 are connected to an output terminal of NOT gate G51.

Sources of P-channel MOS transistors M122, M130, M133, M134 and M136 are connected to power supply node VDD. Sources of N-channel MOS transistors M125, M127, M128, M129, M131, M132, M135 and M138 are connected to ground node VSS.

Moreover, the voltage at node IPCONST of constant current amplification circuit 7 is supplied to the gate of P-channel MOS transistor. M122; therefore, the tail current from differential amplifier A11 is controlled by the voltage at node IPCONST. In other words, an electric current proportional to constant current IMULTI outputted from constant current amplification circuit 7 flows through the voltage follower circuit formed by differential amplifier A11.

With this configuration, in order to generate an oscillation signal CKF in a high frequency, the tail current from differential amplifier A11 can be set to be large. On the other hand, in order to generate an oscillation signal CKF in a low frequency, the tail current from differential amplifier A11 can be set to be small. Thus, the tail current from differential amplifier A11 can be automatically set in accordance with the range of the frequency of oscillation signal CKF in an appropriate manner, leading to reduction in power consumption by the semiconductor device.

Moreover, differential amplifier A11 having an amplification factor of 1 voltage-follower outputs control voltage VINTEG from analog integration circuit 3. With this configuration, it is possible to prevent noise from voltage control and oscillation circuit 5 provided at a stage subsequent to differential amplifier A11 from being transmitted to analog integration circuit 3 provided at a stage prior to differential amplifier A11 and, therefore, to avoid degradation in frequency accuracy of an oscillation signal.

Herein, the semiconductor device according to the embodiment of the present invention generates control voltage VINTEG by feedback control performed by frequency/voltage conversion circuit 2, voltage control and oscillation circuit 5 and the like, thereby achieving high frequency accuracy of oscillation signal CKF. With this configuration, a result of the feedback control is not obtained yet at the time of activation of semiconductor device 101; therefore, a temporary control voltage VINTEG must be generated at the time of activation.

In the semiconductor device according to the embodiment of the present invention, the voltage at node IPCONST is supplied to the gate of P-channel MOS transistor M121. As a result, node VBIASP, that is, the output from differential amplifier A11 is slightly pulled down. Therefore, temporary control voltage VINTEG, that is, a temporary bias voltage VBIASP and a temporary bias voltage VBIASN can be generated only by one P-channel MOS transistor at the time of activation of semiconductor device 101. Thus, it is possible to prevent occurrence of dead lock in a feedback loop including frequency/voltage conversion circuit 2, voltage control and oscillation circuit 5 and the like, through use of a simple configuration.

Herein, a source and a well of P-channel MOS transistor M121 are connected to node PCOM which is a common source of differential amplifier A11. With this configuration, it is possible to reduce the tail current from the differential amplifier to about 1/100 of that in the configuration of using a P-channel MOS transistor having a source and a well connected to the power supply node or the ground node and controlling the tail current from the differential amplifier.

In the semiconductor device according to the embodiment of the present invention, a potential at the common source of differential amplifier A11 is set at a value lower than power supply voltage VDD by, for example, about 200 mV. This setting can be readily realized in such a manner that a subthreshold coefficient of P-channel MOS transistors M124 and M126 forming a differential pair is set at 100 mV/decade.

Figure 12:
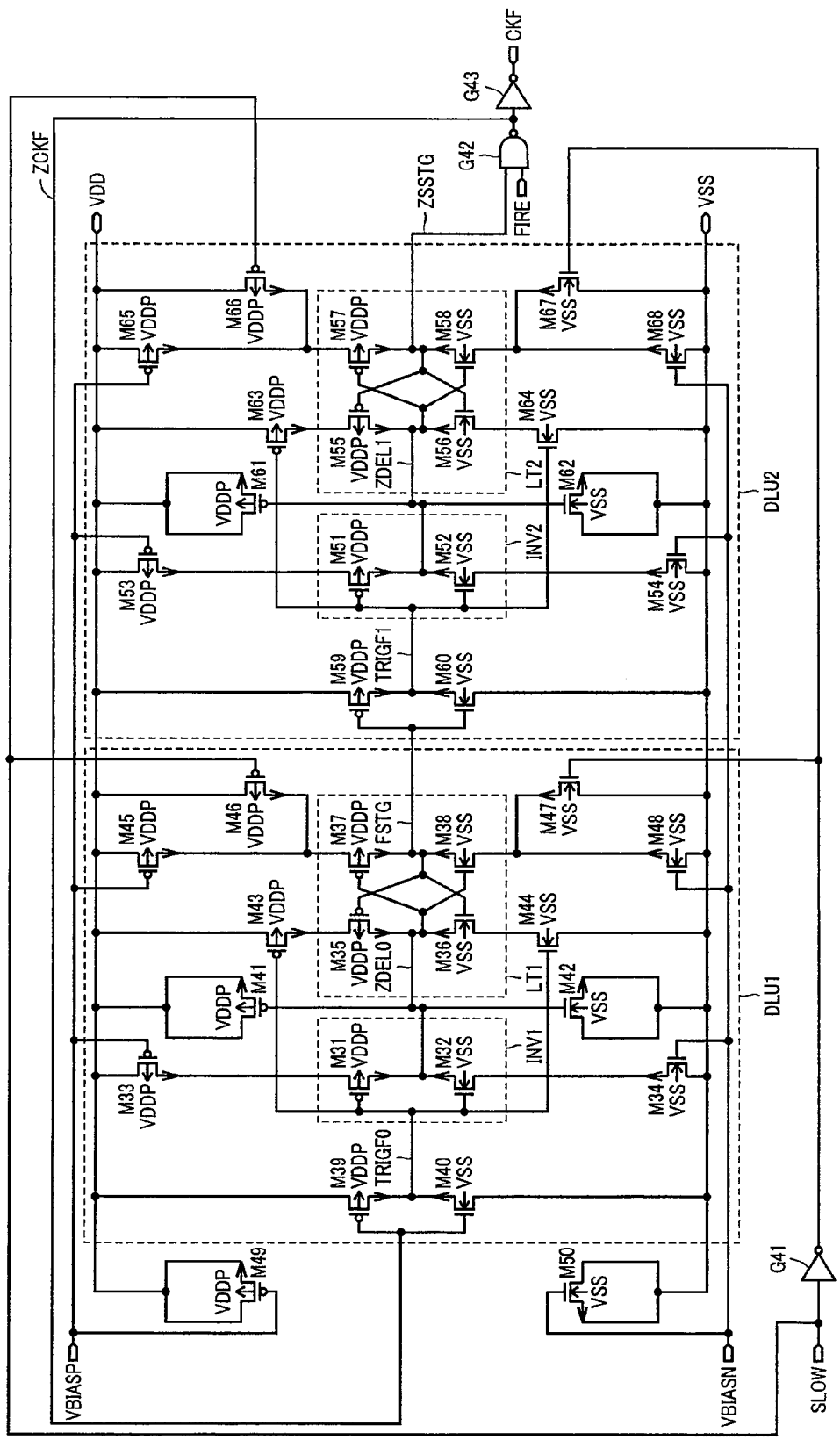
FIG. 12 shows a circuit diagram of a configuration of a voltage control and oscillation circuit 5 in the semiconductor device according to the embodiment of the present invention.

FIG. 12 shows a circuit diagram of a configuration of voltage control and oscillation circuit 5 in the semiconductor device according to the embodiment of the present invention.

With reference to FIG. 12, voltage control and oscillation circuit 5 includes a delay unit DLU1, a delay unit DLU2, NOT gates G41 and G43, and a NAND gate G42. Delay unit DLU1 includes an inverter circuit INV1, a latch circuit LT1, N-channel MOS transistors (MOS capacitors) M42 and M50, P-channel MOS transistors (MOS capacitors) M41 and M49, N-channel MOS transistors M40, M34, M44, M47 and M48, and P-channel MOS transistors M33, M39, M43, M45 and M46. Inverter circuit INV1 includes an N-channel MOS transistor M32 and a P-channel MOS transistor M31. Latch circuit LT1 includes N-channel MOS transistors M36 and M38, and P-channel MOS transistors M35 and M37.

Delay unit DLU2 includes an inverter circuit INV2, a latch circuit LT2, an N-channel MOS transistor (a MOS capacitor) M62, a P-channel MOS transistor (a MOS capacitor) M61, N-channel MOS transistors M60, M54, M64, M67 and M68, and P-channel MOS transistors M53, M59, M63, M65 and M66. Inverter circuit INV2 includes an N-channel MOS transistor M52 and a P-channel MOS transistor M51. Latch circuit LT2 includes N-channel MOS transistors M56 and M58, and P-channel MOS transistors M55 and M57.

In delay unit DLU1, a drain of P-channel MOS transistor M39, a drain of N-channel MOS transistor M40, gates of P-channel MOS transistors M31 and M43, and gates of N-channel MOS transistors M32 and M44 are connected to a node TRIGF0.

A drain of P-channel MOS transistor M31, a drain of N-channel MOS transistor M32, a gate of P-channel MOS transistor M41, a gate of N-channel MOS transistor M42, a drain of P-channel MOS transistor M35, and a drain of N-channel MOS transistor M36 are connected to a node ZDEL0.

A drain of P-channel MOS transistor M37, a drain of N-channel MOS transistor M38, a gate of P-channel MOS transistor M35, and a gate of N-channel MOS transistor M36 are connected to a storage node FSTG.

A source of P-channel MOS transistor M31 is connected to a drain of P-channel MOS transistor M33. A source of N-channel MOS transistor M32 is connected to a drain of N-channel MOS transistor M34. A source of P-channel MOS transistor M37 is connected to drains of P-channel MOS transistors M45 and M46. A source of N-channel MOS transistor M38 is connected to drains of N-channel MOS transistors M47 and M48.

Gates of P-channel MOS transistors M49, M33 and M45 are connected to node VBIASP. Gates of N-channel MOS transistors M50, M34 and M48 are connected to node VBIASN.

Drains and sources of P-channel MOS transistors M49 and M41, and sources of P-channel MOS transistors M33, M39, M43, M45 and M46 are connected to power supply node VDD. Drains and sources of N-channel MOS transistors M50 and M42, and sources of N-channel MOS transistors M34, M40, M44, M47 and M48 are connected to ground node VSS.

In delay unit DLU2, a drain of P-channel MOS transistor M59, a drain of N-channel MOS transistor M60, gates of P-channel MOS transistors M51 and M63, and gates of N-channel MOS transistors M52 and M64 are connected to a node TRIGF1.

A drain of P-channel MOS transistor M51, a drain of N-channel MOS transistor M52, a gate of P-channel MOS transistor M61, a gate of N-channel MOS transistor M62, a drain of P-channel MOS transistor M55, and a drain of N-channel MOS transistor M56 are connected to a node ZDEL1.

A drain of P-channel MOS transistor M57, a drain of N-channel MOS transistor M58, a gate of P-channel MOS transistor M55, and a gate of N-channel MOS transistor M56 are connected to a storage node ZSSTG.

A source of P-channel MOS transistor M51 is connected to a drain of P-channel MOS transistor M53. A source of N-channel MOS transistor M52 is connected to a drain of N-channel MOS transistor M54. A source of P-channel MOS transistor M57 is connected to drains of P-channel MOS transistors M65 and M66. A source of N-channel MOS transistor M58 is connected to drains of N-channel MOS transistors M67 and M68.

Gates of P-channel MOS transistors M53 and M65 are connected to node VBIASP. Gates of N-channel MOS transistors M54 and M68 are connected to node VBIASN.

A drain and a source of P-channel MOS transistor M61, and sources of P-channel MOS transistors M53, M59, M63, M65 and M66 are connected to power supply node VDD. A drain and a source of N-channel MOS transistor M62, and sources of N-channel MOS transistors M54, M60, M64, M67 and M68 are connected to ground node VSS.

Moreover, AND gate G42 has a first input terminal connected to storage node ZSSTG, and a second input terminal connected to node FIRE. An output terminal of AND gate G42, an input terminal of NOT gate G43, a gate of P-channel MOS transistor M39, and a gate of N-channel MOS transistor M40 are connected to a node ZCKF. An output terminal of NOT gate G43 is connected to a node CKF.

An input terminal of NOT gate G41, and gates of P-channel MOS transistors M46 and M66 are connected to a node SLOW. Gates of N-channel MOS transistors M47 and M67 are connected to an output terminal of NOT gate G41.

Storage node FSTG of latch circuit LT1, which is an output node of delay unit DLU1, is connected to an input node of delay unit DLU2. Storage node ZSSTG of latch circuit LT2, which is an output node of delay unit DLU2, is connected to an input node of delay unit DLU1 through AND gate G42.

NAND gate G42 starts or stops the oscillation by voltage control and oscillation circuit 5, based on control signal FIRE. More specifically, NAND gate G42 stops the oscillation by voltage control and oscillation circuit 5 when control signal FIRE is set at the logic low level. On the other hand, NAND gate G42 outputs as an oscillation signal ZCKF an oscillation signal ZSSTG received from delay unit DLU2 when control signal FIRE is set at the logic high level.

NOT gate G43 inverts the logic level of oscillation signal ZCKF received from NAND gate G42, and outputs the resultant signal as oscillation signal CKF.

In delay unit DLU1, inverter circuit INV1 performs charge and discharge on MOS capacitors M41 and M42. P-channel MOS transistor M33 limits an output current from inverter circuit INV1, which is used for performing the charge on MOS capacitors M41 and M42, based on bias voltage VBIASP received from bias voltage generation circuit 4. N-channel MOS transistor M34 limits an output current from inverter circuit INV1, which is used for performing the discharge on MOS capacitors M41 and M42, based on bias voltage VBIASN received from bias voltage generation circuit 4.

In delay unit DLU2, likewise, inverter circuit INV2 performs charge and discharge on capacitors M61 and M62. P-channel MOS transistor M53 limits an output current from inverter circuit INV2, which is used for performing the charge on capacitors M61 and M62, based on bias voltage VBIASP received from bias voltage generation circuit 4. N-channel MOS transistor M54 limits an output current from inverter circuit INV2, which is used for performing the discharge on capacitors M61 and M62, based on bias voltage VBIASN received from bias voltage generation circuit 4.

In each of delay units DLU1 and DLU2, a limited amount of electric current for charge and a limited amount of electric current for discharge are controlled, so that the frequency of oscillation signal CKF is controlled.

For example, when bias voltage VBIASP becomes low, the limited amount of electric current by each of P-channel MOS transistors M33 and M53 becomes small, so that the oscillation frequency of voltage control and oscillation circuit 5 becomes high. On the other hand, when bias voltage VBIASP becomes high, the limited amount of electric current by each of P-channel MOS transistors M33 and M53 becomes large, so that the oscillation frequency of voltage control and oscillation circuit 5 becomes low. Thus, control voltage VINTEG is converted into the oscillation frequency of voltage control and oscillation circuit 5.

Herein, a delay time of delay unit DLU1 is obtained based on a time constant of charge/discharge of each of MOS capacitors M41 and M42 by inverter circuit INV1. This configuration is similar to that of a typical voltage controller/oscillator. In delay unit DLU1, however, the charge or the discharge is performed based on the time constant. When the voltage at storage node ZDEL0 reaches a predetermined threshold value after a lapse of a desired delay time, latch circuit LT1 further performs charge or discharge on each of MOS capacitors M41 and M42 in a rapid manner. Thus, it is possible to quickly perform initialization of delay unit DLU1 in order to obtain a subsequent desired delay time. The same things hold true for delay unit DLU2.

With this configuration, in voltage control and oscillation circuit 5, a small circuit formed by two delay units DLU1 and DLU2 and one NAND gate G42 can establish a state that a voltage at each of storage nodes ZDEL0 and ZDEL1 is power supply voltage VDD or a state that a voltage at each of storage nodes ZDEL0 and ZDEL1 is ground voltage VSS, with certainty, and then can start discharge or charge of each of MOS capacitors M41 and M42 and MOS capacitors M61 and M62. That is, it is possible to reduce a circuit occupied area in the semiconductor device.

Moreover, voltage control and oscillation circuit 5 includes no differential amplifier and no comparator; therefore, no direct current flows through voltage control and oscillation circuit 5. Upon generation of the oscillation signal, accordingly, the semiconductor device according to the embodiment of the present invention consumes the electric current for charge/the electric current for discharge in accordance with the oscillation frequency, but consumes no direct current, leading to reduction in power consumption. That is, an amount of electric current to be consumed becomes small in a case of generating an oscillation signal CKF in a low frequency.

NOT gate G41 inverts a logic level of externally received control signal SLOW, and outputs the resultant signal to the gate of each of N-channel MOS transistors M47 and M67. Each of P-channel MOS transistors M46 and M66 controls an electric current flowing through each of latch circuits LT1 and LT2, based on control signal SLOW received at the gate thereof. Moreover, each of N-channel MOS transistors M47 and M67 controls the electric current flowing through each of latch circuits LT1 and LT2, based on the signal from NOT gate G14, that is, the signal obtained by inverting the logic level of control signal SLOW, which is received at the gate thereof.

That is, it is possible to change the logic level of control signal SLOW in accordance with the range of the frequency of oscillation signal CKF, thereby adjusting the electric current flowing through each of latch circuits LT1 and LT2. Therefore, it is possible to reduce an amount of electric current to be consumed by the semiconductor device.

Figure 13:
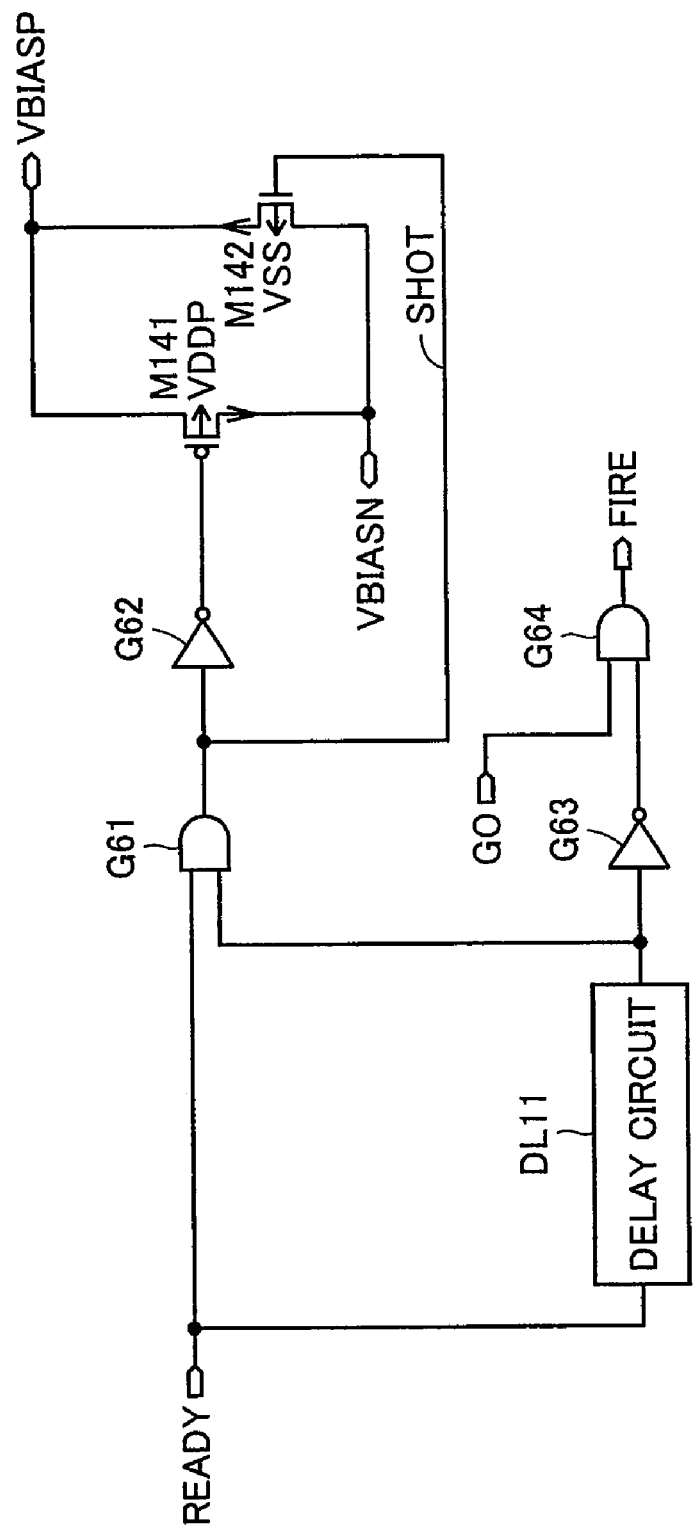
FIG. 13 shows a circuit diagram of a configuration of an activation control circuit 8 in the semiconductor device according to the embodiment of the present invention.
Figure 14:
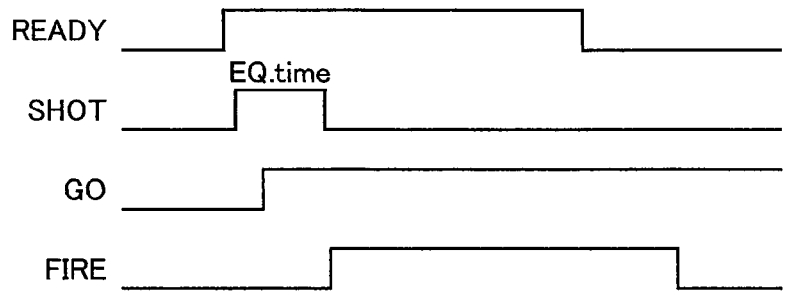
FIG. 14 shows a time chart of operations of activation control circuit 8 in the semiconductor device according to the embodiment of the present invention.
Figure 15:
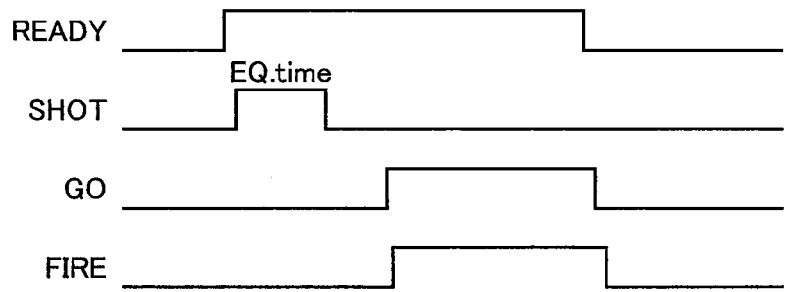
FIG. 15 shows a time chart of operations of activation control circuit 8 in the semiconductor device according to the embodiment of the present invention.

FIG. 13 shows a circuit diagram of a configuration of activation control circuit 8 in the semiconductor device according to the embodiment of the present invention. FIG. 14 shows a time chart of operations of activation control circuit 8 in the semiconductor device according to the embodiment of the present invention. FIG. 15 shows a time chart of operations of activation control circuit 8 in the semiconductor device according to the embodiment of the present invention.

With reference to FIG. 13, activation control circuit 8 includes a delay circuit DL11, AND gates G61 and G64, NOT gates G62 and G63, an N-channel MOS transistor M142, and a P-channel MOS transistor M141.

In the semiconductor device according to the embodiment of the present invention, as described above, pull-down resistor R21 in bias voltage generation circuit 4 generates temporary control voltage VINTEG to start the oscillation by voltage control and oscillation circuit 5.

However, temporary control voltage VINTEG is generated relatively gently. Therefore, it is sufficient to get out of dead lock of a feedback loop; however, it is insufficient to reduce an activation time of semiconductor device 101 in some instances.

With reference to FIGS. 14 and 15, in the semiconductor device according to the embodiment of the present invention, activation control circuit 8 activates P-channel MOS transistor M141 and N-channel MOS transistor M142 to short-circuit node VBIASP and node VBIASN, immediately after an activation preparation signal READY for semiconductor device 101 is set at the logic high level so that a direct current flows into each circuit in semiconductor device 101. This short-circuit time is determined from a delay amount by delay circuit DL11. Thus, each of bias voltage VBIASP and bias voltage VBIASN becomes an intermediate voltage between power supply voltage VDD and ground voltage VSS, so that voltage control and oscillation circuit 5 is actuated forcibly.

Herein, each constant of components in oscillation circuits is set such that voltage control and oscillation circuit 5 oscillates at a low speed of several hundreds of kilohertz in a case where each of bias voltage VBIASP and bias voltage VBIASN is an intermediate voltage between power supply voltage VDD and ground voltage VSS, for example. Thus, it is possible to prevent voltage control and oscillation circuit 5 from oscillating at a high frequency exceeding 100 MHz, at the time of activation of semiconductor device 101. Moreover, it is sufficient to set a potential at node VBIASP and a potential at node VBIASN at a single value for a predetermined time in order to forcibly actuate voltage control and oscillation circuit 5.

Figure 16:
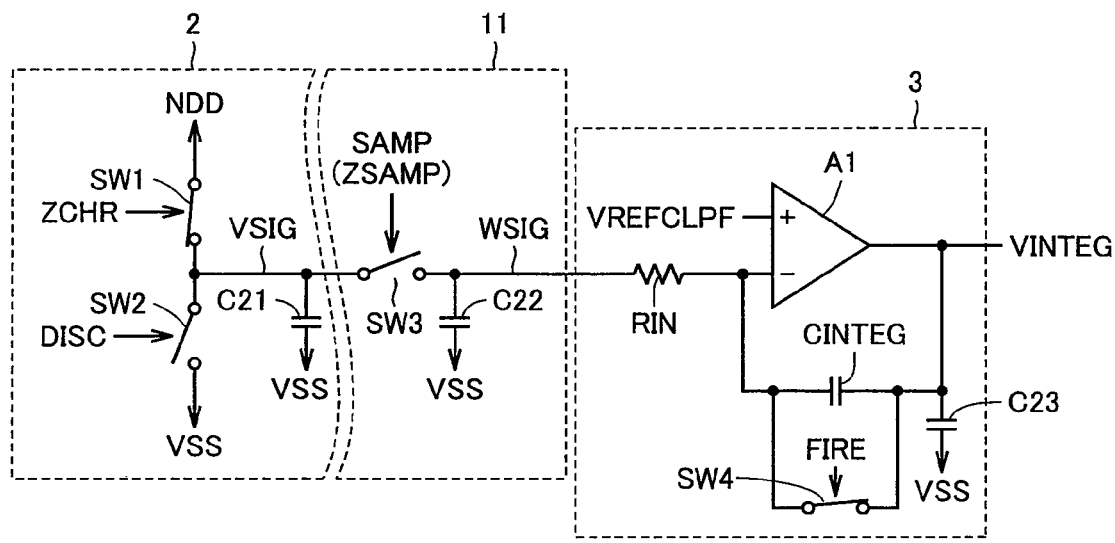
FIG. 16 shows operations of frequency/voltage convention circuit 2, averaging circuit 11 and analog integration circuit 3 at activation of the semiconductor device according to the embodiment of the present invention.

FIG. 16 shows operations of frequency/voltage convention circuit 2, averaging circuit 11 and analog integration circuit 3 at the time of activation of the semiconductor device according to the embodiment of the present invention.

Analog integration circuit 3 has a large time constant to be determined by input resistor RIN and integration capacitor CINTEG. In the semiconductor device according to the embodiment of the present invention, therefore, a result of every frequency/voltage conversion is integrated and averaged, so that feedback control becomes stable and an activation time elapsed until voltage control and oscillation circuit 5 oscillates stably at a preset frequency becomes long. This is a drawback of a method of performing an integrating and averaging process for a long time through use of one analog integrator.

In order to solve this drawback, the semiconductor device according to the embodiment of the present invention adopts the following configuration. That is, at the time of activation, the non-inverting input terminal of differential amplifier A1 in analog integration circuit 3 is supplied with reference voltage VREFCLPF, and then activation control circuit 8 allows switch SW4 to short-circuit the two ends of integration capacitor CINTEG, so that differential amplifier A1 is operated as a voltage follower amplifier.

Thus, the node of the inverting input terminal of differential amplifier A1, which includes a parasitic capacitance of input resistor RIN of analog integration circuit 3, is subjected to initial charge so as to have a voltage equal to reference voltage VREFCLPF, and then the voltage equal to reference voltage VREFCLPF is outputted from differential amplifier A1. Thus, voltage control and oscillation circuit 5 starts to oscillate at a frequency corresponding to reference voltage VREFCLPF. Then, frequency/voltage converting operations are performed by the number of times corresponding to this oscillation frequency, and feedback control is commenced quickly.

Then, differential amplifier A1 is operated as a voltage follower amplifier, and then the short-circuit at the two ends of integration capacitor CINTEG is cancelled. Thus, analog integration circuit 3 performs an analog integrating operation.

With this configuration, it is possible to reduce an activation time required until semiconductor device 101 stably oscillates at a preset frequency.

With reference to FIGS. 14 and 15 again, when activation preparation signal READY for semiconductor device 101 is set at the logic high level and, then, a control signal GO is set at the logic high level, activation control circuit 8 sets control signal FIRE at the logic high level.

Herein, FIGS. 14 and 15 are different from each other in terms of a timing that control signal GO is set at the logic high level. In any cases shown in FIGS. 14 and 15, activation control circuit 8 short-circuits node VBIASP and node VBIASN, and sets control signal FIRE at the logic high level after cancellation of this short-circuit.

As described above, activation control circuit 8 also generates a control signal FIRE for allowing analog integration circuit 3 to operate as a voltage follower amplifier, and collectively manages activation control for semiconductor device 101. Moreover, by changing digital information to be given to semiconductor device 101, an oscillation frequency can be readily changed.

In the semiconductor device according to the embodiment of the present invention, accordingly, it is possible to set various frequencies in a wide range from several hundreds of kilohertz on a low-speed side to several tens of megahertz on a high-speed side, as a frequency of an oscillation signal, without provision of an external crystal resonator or an external ceramic resonator.

It is apparent from the foregoing description that the semiconductor device according to the embodiment of the present invention can be adapted and applied to various product fields including not only universal microcontroller products, but also products requiring high frequency accuracy.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a voltage control and oscillation circuit oscillating at a frequency according to a first control voltage to output an oscillation signal;
   a frequency/voltage conversion circuit receiving said oscillation signal from said voltage control and oscillation circuit and converting a frequency of said oscillation signal into a voltage;
   a control voltage generation circuit generating a new second control voltage having a level between that of said voltage converted by said frequency/voltage conversion circuit and that of a second control voltage generated previously; and
   an analog integration circuit integrating said second control voltage to generate said first control voltage and outputting said first control voltage to said voltage control and oscillation circuit.

2. The semiconductor device according to claim 1, wherein said frequency/voltage conversion circuit includes a capacitor, and charges said capacitor in a time width corresponding to one of a single cycle and a plurality of cycles of said oscillation signal to convert the frequency of said oscillation signal into the voltage.

3. The semiconductor device according to claim 1, further comprising
a constant current generation circuit including a diode-connected MOS transistor, and outputting as a constant current an electric current flowing through said MOS transistor, wherein
said frequency/voltage conversion circuit includes a capacitor, and charges said capacitor with said constant current, based on said oscillation signal, to convert the frequency of said oscillation signal into the voltage.

4. The semiconductor device according to claim 3, wherein said constant current generation circuit includes:
a plurality of said MOS transistors that are serial-connected; and
a plurality of switches arranged in correspondence with said MOS transistors, each of said plurality of switches changing a short-circuit state and a non-short-circuit state between a first conductive electrode and a second conductive electrode of said corresponding MOS transistor.

5. The semiconductor device according to claim 3, further comprising
a constant current amplification circuit amplifying said constant current received from said constant current generation circuit, and outputting the amplified constant current to said frequency/voltage conversion circuit, wherein
said constant current has a variable amplification factor.

6. The semiconductor device according to claim 5, wherein said analog integration circuit includes:
a resistor having a first end receiving said second control voltage, and a second end;
a capacitor having a first end coupled to the second end of said resistor, and a second end; and
a differential amplifier having a non-inverting input terminal receiving a reference voltage, an inverting input terminal coupled to the second end of said resistor, and an output terminal coupled to the second end of said capacitor, and
said differential amplifier has an electric current flowing therethrough in proportion to said amplified constant current.

7. The semiconductor device according to claim 5, further comprising
a voltage follower circuit connected between said analog integration circuit and said voltage control and oscillation circuit, said voltage follower circuit having an electric current flowing therethrough in proportion to said amplified constant current.

8. The semiconductor device according to claim 1, wherein said frequency/voltage conversion circuit includes a first capacitor, and charges said first capacitor with a constant current, based on said oscillation signal, to convert the frequency of said oscillation signal into the voltage,
said control voltage generation circuit includes:
a second capacitor; and
a switch changing a connection state and a disconnection state between said first capacitor and said second capacitor, and said control voltage generation circuit outputs as said second control voltage a voltage at a connection node between said switch and said capacitor to said analog integration circuit.

9. The semiconductor device according to claim 1, wherein said analog integration circuit includes:
a resistor having a first end receiving said second control voltage, and a second end;
a capacitor having a first end coupled to the second end of said resistor, and a second end; and
a differential amplifier having a non-inverting input terminal receiving a changeable reference voltage, an inverting input terminal coupled to the second end of said resistor, and an output terminal coupled to the second end of said capacitor.

10. The semiconductor device according to claim 1, further comprising
a voltage follower circuit connected between said analog integration circuit and said voltage control and oscillation circuit, and
said voltage follower circuit includes:
a first transistor having a control electrode receiving said second control voltage, a first conductive electrode, a second conductive electrode, and a well coupled to said first conductive electrode;
a second transistor having a control electrode coupled to an output node of said voltage follower circuit, a first conductive electrode and a well each coupled to the first conductive electrode of said first transistor, and a second conductive electrode;
a third transistor having a control electrode receiving a voltage for controlling an output current from said voltage follower circuit, a first conductive electrode coupled to a node supplied with a predetermined voltage, and a second conductive electrode coupled to the first conductive electrode of said first transistor; and
a fourth transistor having a control electrode coupled to the control electrode of said third transistor, a first conductive electrode and a well each coupled to the first conductive electrode of said first transistor, and a second conductive electrode coupled to the second conductive electrode of said first transistor.

11. The semiconductor device according to claim 1, wherein
said voltage control and oscillation circuit includes a first delay circuit and a second delay circuit,
each of said first delay circuit and said second delay circuit includes:
a first inverter circuit having an output current limited based on said second control voltage;
a capacitor coupled to an output node of said first inverter circuit; and
a latch circuit having a second inverter circuit and a third inverter circuit, said second inverter circuit having an output node coupled to the output node of said first inverter circuit and an input node of said third inverter circuit, said third inverter circuit having an output node coupled to an input node of said second inverter circuit and an output node of said delay circuit, and
the output node of said first delay circuit is coupled to an input node of said first inverter circuit in said second delay circuit while the output node of said second delay circuit is coupled to an input node of said first inverter circuit in said first delay circuit.

12. The semiconductor device according to claim 1, wherein said voltage control and oscillation circuit includes:

an inverter circuit having an output current limited based on said second control voltage; and a capacitor subjected to charge and discharge by said inverter circuit, and said inverter circuit has an output current for charge of said capacitor and an output current for discharge of said capacitor each of which is limited based on said second control voltage.

13. The semiconductor device according to claim 12, wherein said voltage control and oscillation circuit further includes:

a first transistor having a control electrode receiving a first clamping voltage based on said second voltage, and a conductive electrode coupled to said inverter circuit, and limiting the output current from said inverter circuit used for charge of said capacitor; and a second transistor having a control electrode receiving a second clamping voltage based on said second control voltage, and a conductive electrode coupled to said inverter circuit, and limiting the output current from said inverter circuit used for discharge of said capacitor, said semiconductor device further comprising a switch changing a connection state and a disconnection state between the control electrode of said first transistor and the control electrode of said second transistor.

14. The semiconductor device according to claim 1, wherein said analog integration circuit includes:

a resistor having a first end receiving said second control voltage, and a second end;

a capacitor having a first end coupled to the second end of said resistor, and a second end;

a differential amplifier having a non-inverting input terminal receiving a reference voltage, an inverting input terminal coupled to the second end of said resistor, and an output terminal coupled to the second end of said capacitor; and a switch changing a connection state and a disconnection state between the first end and the second end in said capacitor.

\* \* \* \* \*